US010972117B2

(12) United States Patent
Adut et al.

(10) Patent No.: US 10,972,117 B2
(45) Date of Patent: Apr. 6, 2021

(54) DIFFERENTIAL CLAMP CIRCUITS WITH CURRENT RECIRCULATION

(71) Applicant: Analog Devices International Unlimited Company, Limerick (IE)

(72) Inventors: Joseph Adut, Palo Alto, CA (US); Jeremy Wong, Sunnyvale, CA (US); Eugene Cheung, Fremont, CA (US); Brian Hamilton, Menlo Park, CA (US); Gregory Fung, Fremont, CA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/839,429

(22) Filed: Apr. 3, 2020

(65) Prior Publication Data

US 2021/0075437 A1 Mar. 11, 2021

Related U.S. Application Data

(60) Provisional application No. 62/897,659, filed on Sep. 9, 2019.

(51) Int. Cl.
*H03M 1/34* (2006.01)
*H03M 1/40* (2006.01)
(Continued)

(52) U.S. Cl.
CPC .......... *H03M 1/406* (2013.01); *H03K 17/687* (2013.01); *H03M 1/366* (2013.01)

(58) Field of Classification Search
CPC .............................. H03M 1/406; H03M 1/366
(Continued)

(56) References Cited

U.S. PATENT DOCUMENTS

| 5,369,309 A | 11/1994 | Bacrania et al. |
| 5,371,552 A | 12/1994 | Brummette et al. |

(Continued)

OTHER PUBLICATIONS

Ardizzoni et al., "*Rules of the Road" for High-Speed Differential ADC Drivers*, Analog Dialogue 43-05, May 2009, 11 pages.
(Continued)

*Primary Examiner* — Peguy Jean Pierre
(74) *Attorney, Agent, or Firm* — Patent Capital Group

(57) ABSTRACT

Differential clamp circuits configured to recirculate the current in one clamp, either low-side clamp or high-side clamp, from one output of a differential signal to the other output of the differential signal are disclosed. Differential clamp circuits described herein may be particularly suitable for providing programmable clamps at differential outputs of an ADC driver and may be particularly beneficial to implement clamps that are symmetrical around an ADC's input common-mode voltage. Some differential clamp circuit described herein may advantageously present a smaller capacitive load at each output, thus reducing bandwidth degradation of the output stage. Furthermore, differential clamp circuits described herein may operate with only one control voltage, making it easier to limit the output excursions symmetrically around the default common-mode voltage.

28 Claims, 18 Drawing Sheets

(51) Int. Cl.
    *H03K 17/687*     (2006.01)
    *H03M 1/36*     (2006.01)

(58) Field of Classification Search
    USPC .............................. 341/120, 118, 155, 163
    See application file for complete search history.

(56) References Cited

U.S. PATENT DOCUMENTS

| | | | |
|---|---|---|---|
| 5,859,569 | A | 1/1999 | Le et al. |
| 6,504,435 | B1 * | 1/2003 | Martins ................ H03F 3/3023 |
| | | | 330/292 |
| 6,590,435 | B1 | 7/2003 | Hannan et al. |
| 7,474,247 | B1 | 1/2009 | Heinks et al. |
| 7,724,061 | B2 | 5/2010 | Chon et al. |
| 8,446,203 | B1 | 5/2013 | Adut |
| 10,211,846 | B1 * | 2/2019 | Phillips ..................... H03F 1/52 |
| 2004/0041612 | A1 | 3/2004 | Huber |
| 2012/0025891 | A1 | 2/2012 | Doorenbos et al. |
| 2018/0191244 | A1 * | 7/2018 | Lin ..................... H02M 3/1588 |
| 2018/0275250 | A1 | 9/2018 | Adut |
| 2018/0284229 | A1 | 10/2018 | Liu et al. |
| 2018/0284272 | A1 | 10/2018 | Adut |

OTHER PUBLICATIONS

Office Action issue in EP20192616.9 dated Feb. 3, 2021, 10 pages.

\* cited by examiner

DIFFERENTIAL CLAMP CIRCUITS WITH CURRENT RECIRCULATION

CROSS REFERENCE TO RELATED APPLICATIONS

This application claims the benefit of and priority from U.S. Patent Application No. 62/897,659, filed Sep. 9, 2019, titled "DIFFERENTIAL CLAMP CIRCUITS," the disclosure of which is hereby incorporated by reference herein in its entirety.

TECHNICAL FIELD OF THE DISCLOSURE

The present disclosure relates generally to electronics and, more specifically, to clamp circuits that set minimum and maximum voltages at an output of another circuit.

BACKGROUND

In certain applications, it is desirable to control the highest and the lowest levels of an input signal. This is referred to, respectively, as "high-side clamping" and "low-side clamping." High-side clamping may be used to limit the input signal to a device to avoid damage. Low-side clamping may be used to set a minimum voltage into a device to ensure proper operation of the device. Clamping also limits the maximum range input signal to a device.

An analog-to-digital converter (ADC) is one type of a device that is typically implemented in combination with clamping of input signals provided thereto. An ADC may be overloaded when an input signal provided thereto exceeds minimum and maximum voltages within the ADC's full-scale range. High-speed ADCs, for example those used as modern pipeline converters, may also overload if common-mode voltages of input signals provided to the ADCs are not maintained in a narrow band (e.g., less than 100 millivolts (mV)) around the input common-mode voltages of the ADCs. Overload conditions are highly undesirable because, even for high-speed ADCs, it may take several microseconds or even milliseconds before an ADC recovers from the overload, during which time the ADC is not be able to acquire and process input signals even if the input signals are within the full-scale of the ADC. An ADC being temporarily disabled may be absolutely critical in some applications, such as light detection and ranging (LIDAR) systems. For example, if an ADC in a LIDAR receiver signal chain overloads, the LIDAR will be blind to its surroundings until the ADC recovers.

An electronic component configured to perform clamping of input signals provided to an ADC is referred to as an "ADC driver" and may be a key factor in enabling an associated ADC to achieve its desired performance. To that end, first of all, the ADC driver, which is typically operated at a higher supply voltage than the ADC, should ensure that the driver's maximum output never exceeds the ADC's supply to protect to ADC from permanent damage. Second, the ADC driver should condition its outputs as not to overload the ADC. An ADC may be overloaded when the outputs from an ADC driver exceed the minimum and maximum voltages within the ADC's full-scale range. Besides clamping, an ADC driver may perform other signal conditioning functions such as buffering, amplitude scaling, single-ended-to-differential and differential-to-single-ended conversion, common-mode offset adjustment, and filtering, typically aimed to reduce or eliminate the chances of temporarily disabling or permanently destroying the ADC.

A variety of factors can affect the cost, quality and robustness of a clamp circuit included in an ADC driver or any other device where the highest and lowest levels of an output signal may need to be controlled before providing such a signal as an input to another device. Physical constraints such as space/surface area and also regulations can pose further constraints to the requirements or specifications of a clamp circuit, and, thus, trade-off and ingenuity have to be exercised.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts.

DESCRIPTION OF EXAMPLE EMBODIMENTS OF THE DISCLOSURE

Overview

Figure 1:
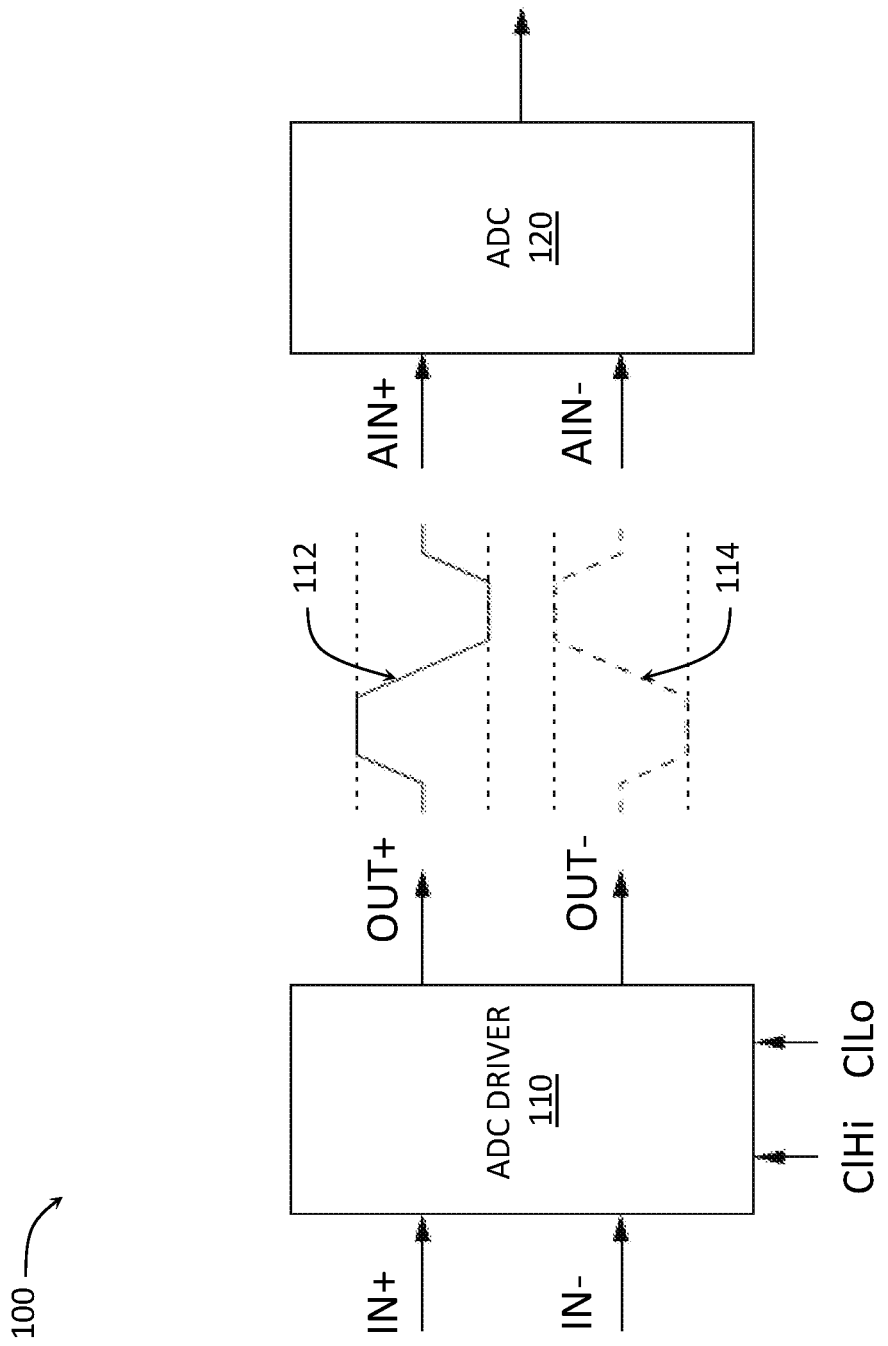
FIG. 1 is a schematic diagram of an ADC system with an ADC driver with high-side and low-side clamps.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

Some ADCs operate better when the input signals provided to them are differential signals. ADC drivers for such ADCs condition the signals to provide differential signals (i.e., differential outputs from the ADC drivers) to the ADC inputs. A differential signal is provided (e.g., output by an ADC driver) via two outputs: a positive output (denoted herein as "OUT+") and a negative output (denoted herein as "OUT−"). Clamping a differential signal includes making sure that, for each of the two outputs, an amplitude of the output does not fall below a minimum value set by what is referred to as a "low-side clamp" and does not exceed a maximum value set by what is referred to as a "high-side clamp." In the following, the term "differential clamp circuit" is used to describe a clamp circuit that may be used to clamp outputs of a differential signal. Providing a differential clamp circuit to clamp the differential outputs of, for example, an ADC driver may help ensure that an ADC that receives the differential outputs of the ADC driver as an input does not get damaged or become overloaded.

Conventional differential clamp circuits include a low-side clamp and a high-side clamp for each of the positive and negative outputs of a signal. Inventors of the present disclosure realized that such circuits have a number of shortcomings. One shortcoming resides in the fact that high-side clamps are typically implemented using PNP transistors which, due to the lower carrier mobility of PNP transistors, suffer from limited speed and current absorption, compared to NPN transistors. Another shortcoming resides in challenges of maintaining the common-mode voltages of input signals provided to the ADCs in bands that are sufficiently narrow to make sure the ADCs do not overload. Furthermore, providing, for each of the positive and negative outputs of a differential signal, two different control voltages to control the high-side and the low-side clamping complicates the clamp circuit and makes it difficult to make sure that the output excursions are symmetric around default common-mode voltages for ADCs.

Various aspects of the present disclosure relate to clamp circuits that may be used to clamp differential signal outputs (i.e., relate to differential clamp circuits). In particular, differential clamp circuits described in the present disclosure are based on recognition that, instead of using both a low-side clamp and a high-side clamp for each of the two outputs of a differential signal, only one type of these clamps may be implemented for each of the two outputs (e.g., in some embodiments—only the low-side clamp for each of the outputs OUT+ and OUT−, and, in other embodiments—only the high-side clamp for each of the outputs OUT+ and OUT−), with the other type being inferred by recirculating the current to the other output. Clamps described herein may be triggered on voltage but maintain minimum or maximum voltage by modulating current on a given node.

The exact design of differential clamp circuits with current recirculation, described herein, may be realized in many different ways, all of which being within the scope of the present disclosure. In one example of design variations according to various embodiments of the present disclosure, a choice can be made, individually for each of the transistors of a differential clamp circuit with current recirculation, to employ bipolar transistors (e.g., where various transistors may be NPN or PNP transistors), field-effect transistors (FETs), e.g., metal-oxide-semiconductor (MOS) technology transistors (e.g., where various transistors may be N-type MOS (NMOS) or P-type MOS (PMOS) transistors), or a combination of one or more FETs and one or more bipolar transistors. In view of that, in the following descriptions, transistors are sometimes described with reference to their first, second, and third terminals. The term "first terminal" of a transistor is used to refer to an emitter terminal if the transistor is a bipolar transistor or to a source terminal if the transistor is a FET, the term "second terminal" of a transistor is used to refer to a collector terminal if the transistor is a bipolar transistor or to a drain terminal if the transistor is a FET, and the term "third terminal" of a transistor is used to refer to a base terminal if the transistor is a bipolar transistor or to a gate terminal if the transistor is a FET. These terms remain the same irrespective of whether a transistor of a given technology is an N-type transistor (e.g., an NPN transistor if the transistor is a bipolar transistor or an NMOS transistor if the transistor is a FET) or a P-type transistor (e.g., a PNP transistor if the transistor is a bipolar transistor or a PMOS transistor if the transistor is a FET).

In another example, in various embodiments, a choice can be made, individually for each of the transistors of a differential clamp circuit with current recirculation, as to which transistors are implemented as N-type transistors (e.g., NMOS transistors for the transistors implemented as FETs, or NPN transistors for the transistors implemented as bipolar transistors) and which transistors are implemented as P-type transistors (e.g., PMOS transistors for the transistors implemented as FETs, or PNP transistors for the transistors implemented as bipolar transistors). In yet other examples, in various embodiments, a choice can be made as to what type of transistor architecture to employ. For example, any of the transistors of the differential clamp circuits with current recirculation as described herein that are implemented as FETs may be planar transistors or may be non-planar transistors (some examples of the latter including FinFETs, nanowire transistors or nanoribbon transistors).

Low-side clamps may be faster than high-side clamps because the low-side clamps may be implemented using N-type transistors (e.g., NPN transistors), which are inherently faster than P-type transistors (e.g., PNP transistors) typically used to implement high-side clamps. Therefore, some embodiments of differential clamp circuits described herein are based on recognition that recirculating the current in a faster clamp (e.g., in a low-side clamp) from one output of the circuit to the other may help overcome the problem of lower carrier mobility in P-type transistors. In such embodiments, a differential clamp circuit may include a first low-side clamp (e.g., a first low-side clamp transistor Q2A) associated with an negative output OUT- and a second low-side clamp (e.g., a second low-side clamp transistor Q2B) associated with a positive output OUT+. In such a differential clamp circuit, recirculating the current from the low-side clamp that was triggered to turn on (because the associated output fell below the limit set by the low-side clamp) may be used to realize the high-side clamping on the other output. For example, a differential clamp circuit may be such that, if the load at the output OUT- falls short of the minimum current required to maintain the output OUT- at a minimum voltage, then the first low-side clamp turns on to add current to the OUT- to make up the difference to the load and prevent that the output OUT- is being below the minimum voltage. At the same time, when this happens, the current added by the first low-side clamp to the output OUT- is recirculated to the output OUT+ to divert current away from the load to keep the output OUT+ from exceeding a maximum voltage, thus effectively implementing the high-side clamp for the output OUT+ without needing to implement a designated high-side clamp circuit and a designated control voltage ClHi. In such a differential clamp circuit, when the first low-side clamp is triggered to turn on, the second low-side clamp is turned off, and vice versa. The second low-side clamp will be triggered to turn on if the associated output OUT+ falls short of the minimum current required to maintain the output OUT+ at a minimum voltage (the first low-side clamp is then turned off). In such a case, the second low-side clamp would turn on to add current to the OUT+ to make up the difference to the load and prevent that the output OUT+ is being below the minimum voltage. At the same time, when this happens, the current added by the second low-side clamp to the output OUT+ would be recirculated to the output OUT- to divert current away from the load to keep the output OUT- from exceeding a maximum voltage, thus effectively implementing the high-side clamp for the output OUT- without needing to implement a designated high-side clamp circuit and a designated control voltage ClHi.

While including only the low-side clamps may be particularly advantageous in some scenarios, some embodiments of differential clamp circuits described herein may employ an analogous concept of current recirculation by implementing only the high-side clamps at each of the two differential outputs of a differential signal. In such embodiments, a differential clamp circuit may include a first high-side clamp (e.g., a first high-side clamp transistor Q2A, shown in FIG. 5B or FIG. 7B) associated with an negative output OUT- and a second high-side clamp (e.g., a second high-side clamp transistor Q2B, shown in FIG. 5B or FIG. 7B) associated with a positive output OUT+. In such a differential clamp circuit, recirculating the current from the high-side clamp that was triggered to turn on (because the associated output exceeded the limit set by the high-side clamp) may be used to realize the low-side clamping on the other output. For example, a differential clamp circuit may be such that, if the load at output OUT- exceeds the maximum current allowed to maintain the output OUT- at a maximum voltage, then the first high-side clamp turns on to divert current from the load to keep the output OUT- from exceeding a maximum voltage. At the same time, when this happens, the current diverted by the first high-side clamp from the output OUT- is recirculated to the output OUT+ to add current to make up the difference to the load and prevent that the output OUT+ is below the minimum voltage, thus effectively implementing the low-side clamp for the output OUT+ without needing to implement a designated low-side clamp circuit and a designated control voltage ClLo. In such a differential clamp circuit, when the first high-side clamp is triggered to turn on, the second high-side clamp is turned off, and vice versa. The second high-side clamp will be triggered to turn on if the load at the associated output OUT+ exceeds the maximum current allowed to maintain the output OUT+ at a maximum voltage, in which case the second high-side clamp turns on to divert current from the load to keep the output OUT+ from exceeding a maximum voltage (the first high-side clamp will be turned off). At the same time, when this happens, the current diverted by the second high-side clamp from the output OUT+ would be recirculated to the output OUT- to add current to make up the difference to the load and prevent that the output OUT- from being below the minimum voltage, thus effectively implementing the low-side clamp for the output OUT- without needing to implement a designated low-side clamp circuit and a designated control voltage ClLo.

To summarize, differential clamp circuits configured to recirculate the current in one clamp, either low-side clamp or high-side clamp, from one output of a differential signal to the other output of the differential signal are disclosed. Differential clamp circuits described herein may be particularly suitable for providing programmable clamps at the differential outputs of an ADC driver and may be particularly beneficial to implement clamps that are symmetrical around an ADC's input common-mode voltage. Some differential clamp circuit described herein may advantageously present a smaller capacitive load at each output, thus reducing the bandwidth degradation at the output. Furthermore, differential clamp circuits described herein may operate with only one control voltage, making it easier to limit the output excursions symmetrically around the default common-mode voltage.

Other aspects of the present disclosure provide systems, e.g., ADC arrangements or LIDAR systems (in particular, LIDAR receivers), that may include one or more differential clamp circuits with current recirculation as described herein, as well as methods for operating such systems and methods for determining distance to at least one object using such systems. While some embodiments of the present disclosure refer to ADC and LIDAR as example systems in which differential clamp circuits with current recirculation as described herein may be implemented, in other embodiments, differential clamp circuits with current recirculation as described herein may be implemented in systems other than ADC and LIDAR, all of which embodiments being within the scope of the present disclosure.

Some example implementations of differential clamp circuits with current recirculation are shown in FIGS. 5A-11B. However, any implementation of the differential clamp circuits with current recirculation in line with the descriptions provided herein is within the scope of the present disclosure.

As will be appreciated by one skilled in the art, aspects of the present disclosure, in particular aspects of differential clamp circuits with current recirculation as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "arrangement," "module," or "system." At least some of the functions described in this disclosure may be implemented as an algorithm executed by one or more hardware processing units, e.g. one or more microprocessors, of one or more computers. In various embodiments, different steps and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to various devices and systems (e.g. to various components and arrangements of components of clamp circuits, ADC drivers, ADCs, LIDAR receivers, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Sometimes, in the present descriptions, the term "circuit" may be omitted (e.g., a clamp circuit may be referred to simply as a "clamp," etc.). If used, the terms "substantially," "approximately," "about," etc., may be used to generally refer to being within +/−20% of a target value, e.g., within +/−10% of a target value, based on the context of a particular value as described herein or as known in the art.

Example Operation of Differential Clamp Circuits

For purposes of illustrating differential clamp circuits with current recirculation proposed herein, it might be useful to first understand setting in which differential clamp circuits may be used, as well as phenomena that may come into play when signal clamping is performed. The following foundational information may be viewed as a basis from which the present disclosure may be properly explained. Such information is offered for purposes of explanation only and, accordingly, should not be construed in any way to limit the broad scope of the present disclosure and its potential applications.

FIG. 1 is a schematic diagram of an ADC system 100 that includes an ADC driver 110 and an ADC 120. The ADC driver 110 is a differential ADC driver with low-side clamps controlled by a reference voltage ClLo and with high-side clamps controlled by a reference voltage ClHi. In the following, the notation "ClLo" (where "Cl" stands for "Clamp" and "Lo" stands for "low") is used to refer to a control signal (e.g., a control voltage ClLo) for clamping the minimum voltage at each output (i.e., both the positive output, e.g. OUT+, and the negative output, e.g. OUT−) from the ADC driver 110. On the other hand, the notation "ClHi" (where "Cl" stands for "Clamp" and "Hi" stands for "high") is used to refer to a control signal (e.g., a control voltage ClHi) for clamping the maximum voltage at each output from the ADC driver 110. As shown in FIG. 1, the ADC driver 110 may receive analog differential input signals (shown in FIG. 1 as IN+ and IN−), e.g., sine waves. The ADC driver 110 may then generate analog differential output signals (shown in FIG. 1 as OUT+ and OUT−) that are clamped, compared to the differential input signals. The dashed lines shown in FIG. 1 above and below each of the positive and negative outputs 112, 114 signify the high-side and low-side clamp voltages. The output from the ADC driver 110 is provided as an input to the ADC 120. For example, the differential input signals for the ADC 120 (shown in FIG. 1 as AIN+ and AIN−) may be based on the clamped differential output signals OUT+ and OUT− of the ADC driver 110. In this manner, the ADC driver 110 is configured to limit the minimum and maximum voltages that the ADC 120 with differential inputs will be exposed to. The high-side and low-side clamping voltages may be selected/adjusted by using the control signals ClHi and ClLo.

Figure 2A:
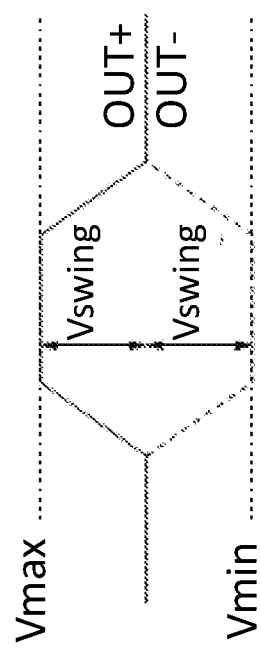
FIG. 2A shows an exemplary output waveform of an ADC driver in response to a differential input voltage without clamping.
Figure 2B:
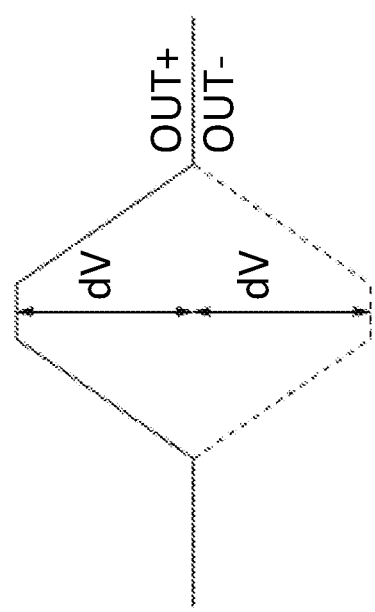
FIG. 2B shows an exemplary output waveform of an ADC driver in response to a differential input voltage with clamping.

FIG. 2A shows an exemplary output waveform of an ADC driver in response to a differential input voltage without clamping. FIG. 2B shows an exemplary output waveform of an ADC driver in response to a differential input voltage with clamping to limit differential excursions (i.e., voltage swings) of each output.

Figure 3:
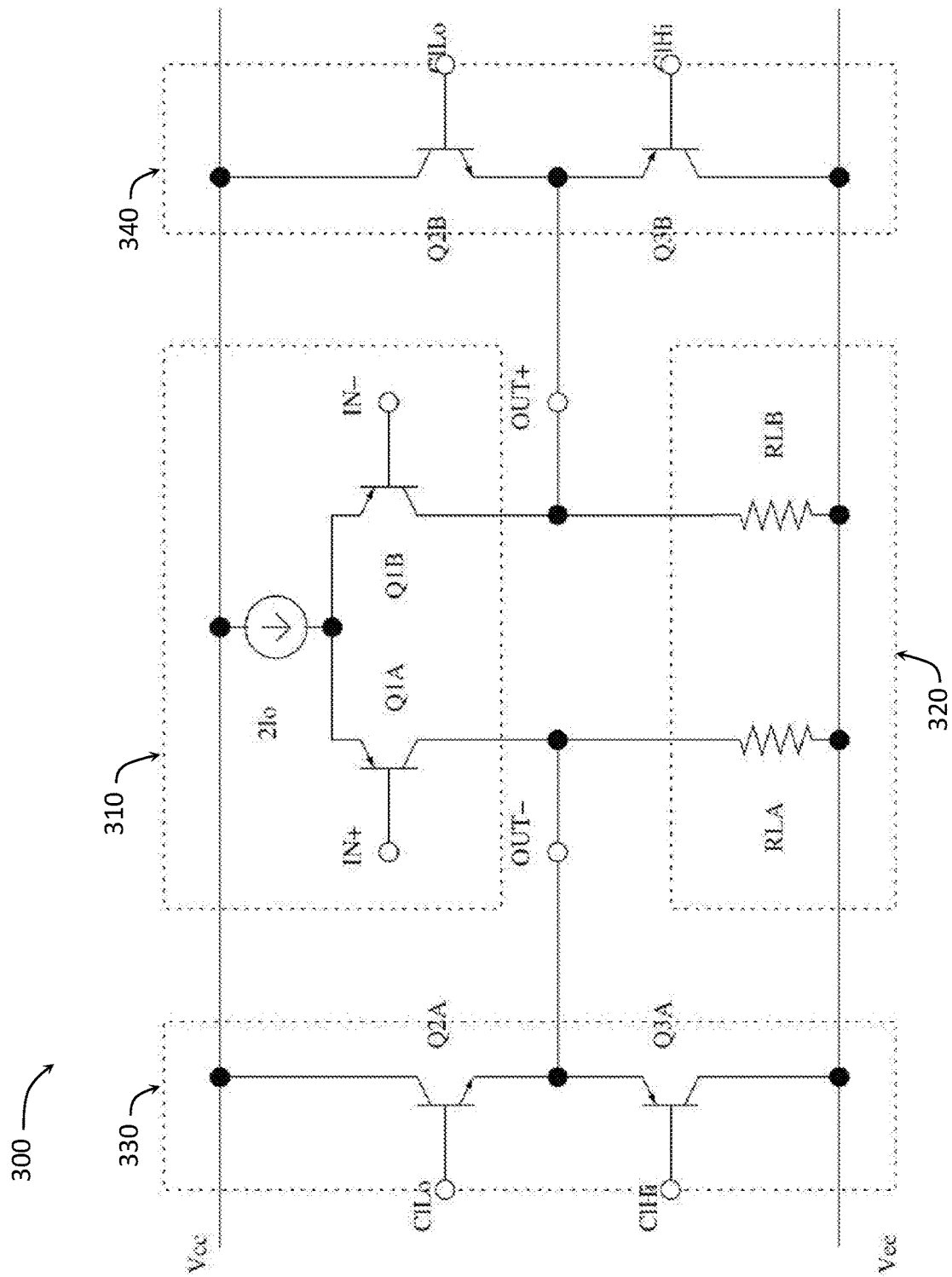
FIG. 3 is an electric circuit diagram of an output stage with a differential pair with high- and low-side clamps at each output.

FIG. 3 is an electric circuit diagram of a typical output stage 300 with a differential pair with high- and low-side clamps at each output. In general, the term "output stage" typically refers to a circuit configured to condition a signal in some manner before providing it as an input signal to a further electronic component. The output stage 300, as well as other output stages described herein, may be included in an ADC driver.

As shown in FIG. 3, a typical output stage driving an ADC with an input common-mode voltage near ground may include a differential pair 310, e.g., transistors Q1A and Q1B biased by a tail-current 2Io, and a differential load 320, e.g., represented by resistors RLA and RLB (it should be noted that embodiments of the present disclosure are equally applicable to differential loads represented by other elements, such as transistors, or a combination of resistors and transistors). In general, as used herein, a "differential load" refers to any load to which the differential output signals OUT+, OUT−, or signal based thereon, are to be provided, e.g., an ADC. The output stage 300 may have additional passive and/or active components to set or regulate the outputs to a desired common-mode output voltage to match the input common-mode of the ADC.

In the output stage 300, a low-side and a high-side clamp may be used to limit the minimum and maximum voltage at each output of the output stage 300, respectively. The minimum voltage at the negative output OUT− of the output stage 300 may be limited by the low-side clamp formed by an NPN transistor Q2A controlled by a reference voltage ClLo. The maximum voltage at the negative output OUT− may be limited by the high-side clamp formed by a PNP transistor Q3A controlled by a reference voltage ClHi. The minimum voltage at the positive output OUT+ of the output stage 300 may be limited by the low-side clamp formed by an NPN transistor Q2B controlled by the reference voltage ClLo. The maximum voltage at the positive output OUT+ may be limited by the high-side clamp formed by a PNP transistor Q3B controlled by the reference voltage ClHi. Thus, in the output stage 300, a circuit 330 (encircled with a dashed contour) includes a low-side and a high-side clamp for the negative output of the output stage 300, OUT− (i.e., the circuit 330 may be referred to as an "negative output clamp circuit 330"), while a circuit 340 (also encircled with a dashed contour) includes a low-side and a high-side clamp for the positive output of the output stage 300, OUT+(i.e., the circuit 340 may be referred to as a "positive output clamp circuit 340"). When the output voltage exceeds limits set by the clamp control voltages, then the clamp transistors of the output stage 300 will turn on. For example, a low-side clamp of the output stage 300 will turn on if the output current falls short of the minimum current required to maintain the output OUT− at a minimum voltage, to make up the difference to the load 320. Similarly, a high-side clamp of the output stage 300 will turn on if the output current exceeds the maximum current to keep the output OUT+ at a maximum voltage, to divert the extra current away from the load 320. Such operation of the clamps can be illustrated by an example provided in FIG. 4 that shows clamps in action.

Figure 4:
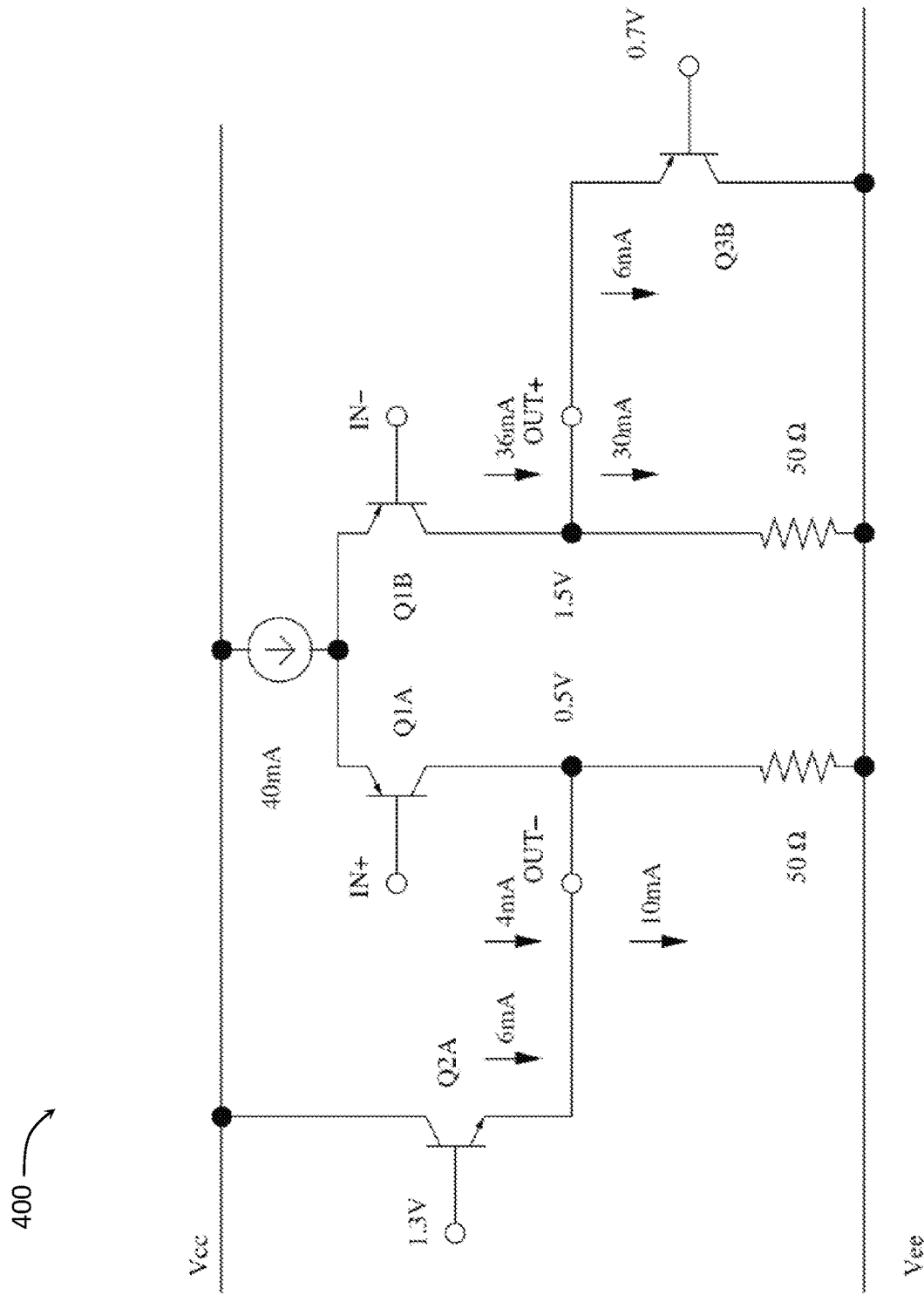
FIG. 4 is an electric circuit diagram showing example operating currents for the clamping of the output stage shown in FIG. 3.

FIG. 4 is an electric circuit diagram showing example operating currents for the clamps of the output stage shown in FIG. 3. In FIG. 4, the tail current 2Io is assumed to be 40 milliampere (mA), and each of the load resistors RLA and RLB are assumed to be 50 Ohm (Ω). With no differential input voltage across terminals IN+ and IN−, transistors Q1A and Q1B will share the tail current equally, $Ic_{Q1A}=Ic_{Q1B}=20$ mA (where, as used herein, "Ic" refers to "collector current" of a given transistor), such that each output is at 1.0V, and, therefore, the output common-mode voltage is also 1.0V.

In response to a differential input voltage, most of the tail current may be steered through transistor Q1B such that, $Ic_{Q1B}=36$ mA and $Ic_{Q1A}=2Io-Ic_{Q1B}=40$ mA−36 mA=4 mA. Without any limiting by clamps, the output voltages on the loads RLA and RLB would be, respectively, 0.2V and 1.8V. Assuming now that ClHi is set at 0.7V and ClLo is set at 1.3V, and assuming that base-emitter voltages ($V_{BE}$) of the transistors Q2A and Q2B are $V_{BEQ2A}=|V_{BEQ2B}|=0.8V$, minimum output voltage will be limited to ClLo-$V_{BEQ2A}$=1.3V−0.8V=0.5V and maximum output voltage will be limited to ClHi-$V_{BEQ2B}$=ClHi−(−0.8V)=0.7V−(−0.8V)=1.5V. With these limits, the low-side clamp Q2A will turn on to supply an extra current of 6 mA in order to keep the negative output OUT− from falling below 0.5V (0.2V+6 mA*50=0.5V), and the high-side clamp Q3B will also to turn on to divert an extra current of 6 mA in order to keep the positive output OUT+ from exceeding 1.5V (1.8V−6 mA*50Ω=1.5V). If the limits are set symmetrically around the output common-mode voltage for differential outputs (which is the case for this example because the output common-mode voltage is 1.0V and the limits are ClHi-$V_{BEQ2B}$=ClHi−(−0.8V)=0.7V−(−0.8V)=1.5V and to ClLo-$V_{BEQ2A}$=1.3V−0.8V=0.5V, so each 0.5V away from the output common-mode voltage of 1V), the low-side and high-side clamp will conduct the same amount of current (6 mA in this example). Clamp transistors Q3A and Q2B, shown in FIG. 3, are not shown in FIG. 4 because they remain off in this example. The clamp transistor Q3A is off because the negative output OUT− does not exceed 1.5V (because the negative output OUT− is equal to 0.5V), and the clamp transistor Q2B is off because the positive output OUT+ is not below 0.5V (because the positive output OUT+ is equal to 1.5V).

Differential Clamp Circuits with Current Recirculation

Embodiments of the present disclosure are based on recognition that clamping implemented in the conventional output stage as shown in FIG. 3 has several drawbacks. For example, one drawback is that the high-side clamp of FIG. 3 is implemented using P-type transistors (e.g., the PNP transistors Q3A and Q3B, shown in FIG. 3), which are inherently slower than N-type transistors (e.g., the NPN transistors Q2A and Q2B, shown in FIG. 3). Another drawback is that two control voltages are required (i.e., ClLo and ClHi).

In this disclosure, differential clamp circuits that recirculate the current in the faster low-side clamp from one output to the other are proposed, which may help overcome the problem of lower carrier mobility of the P-type transistors (with respect to the N-type transistors). In particular, FIGS. 5A, 7A, 10A, and 11A illustrate different embodiments of output stages with differential clamp circuits with only one low-side clamp at each output, OUT− and OUT+, of the output stages (i.e., with only one control voltage, ClLo, being used, with the control voltage ClHi being omitted). When the low-side clamp on one output of a differential signal is engaged (i.e., is triggered or is on because the voltage at that output falls below the minimum voltage set by the low-side clamp), a portion of the current that the clamp diverts to the positive supply may be recirculated to the other output of the differential signal to effect a high-side clamp without the need for using a high-clamp circuit and without the need for using a control voltage ClHi. While recirculating the current in the faster low-side clamp may be particularly advantageous in terms of overcoming the problem of lower carrier mobility in P-type transistors, the general idea of recirculating current in this manner may also be used to implement differential clamp circuits that recirculate the current in the high-side clamp from one output to the other. In particular, FIGS. 5B, 7B, 10B, and 11B illustrate different embodiments of output stages with differential clamp circuits with only one high-side clamp at each output (i.e., with only one control voltage, ClHi, being used, with the control voltage ClLo being omitted). When the high-side clamp on one output of a differential signal is engaged (i.e., is triggered or is on because the voltage at that output exceeds the maximum voltage set by the high-side clamp), a portion of the current that the clamp diverts to the positive supply may be recirculated to the other output of the differential signal to effect a low-side clamp without the need for using a low-clamp circuit and without the need for using a control voltage ClLo.

Figure 5A:
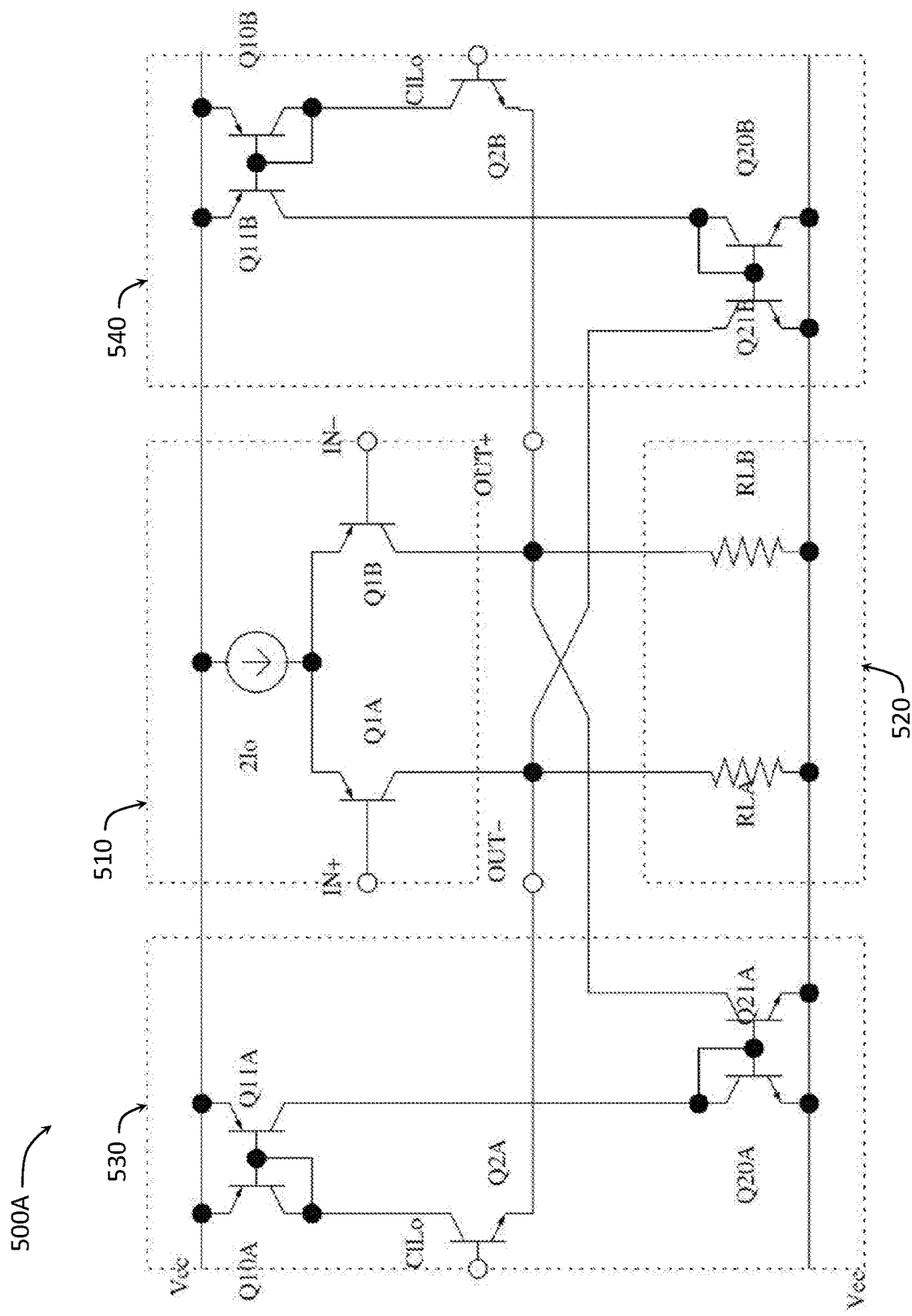
FIG. 5A is an electric circuit diagram of an output stage with a differential pair and differential clamps with only a low-side control voltage ClLo, according to some embodiments of the present disclosure.
Figure 5B:
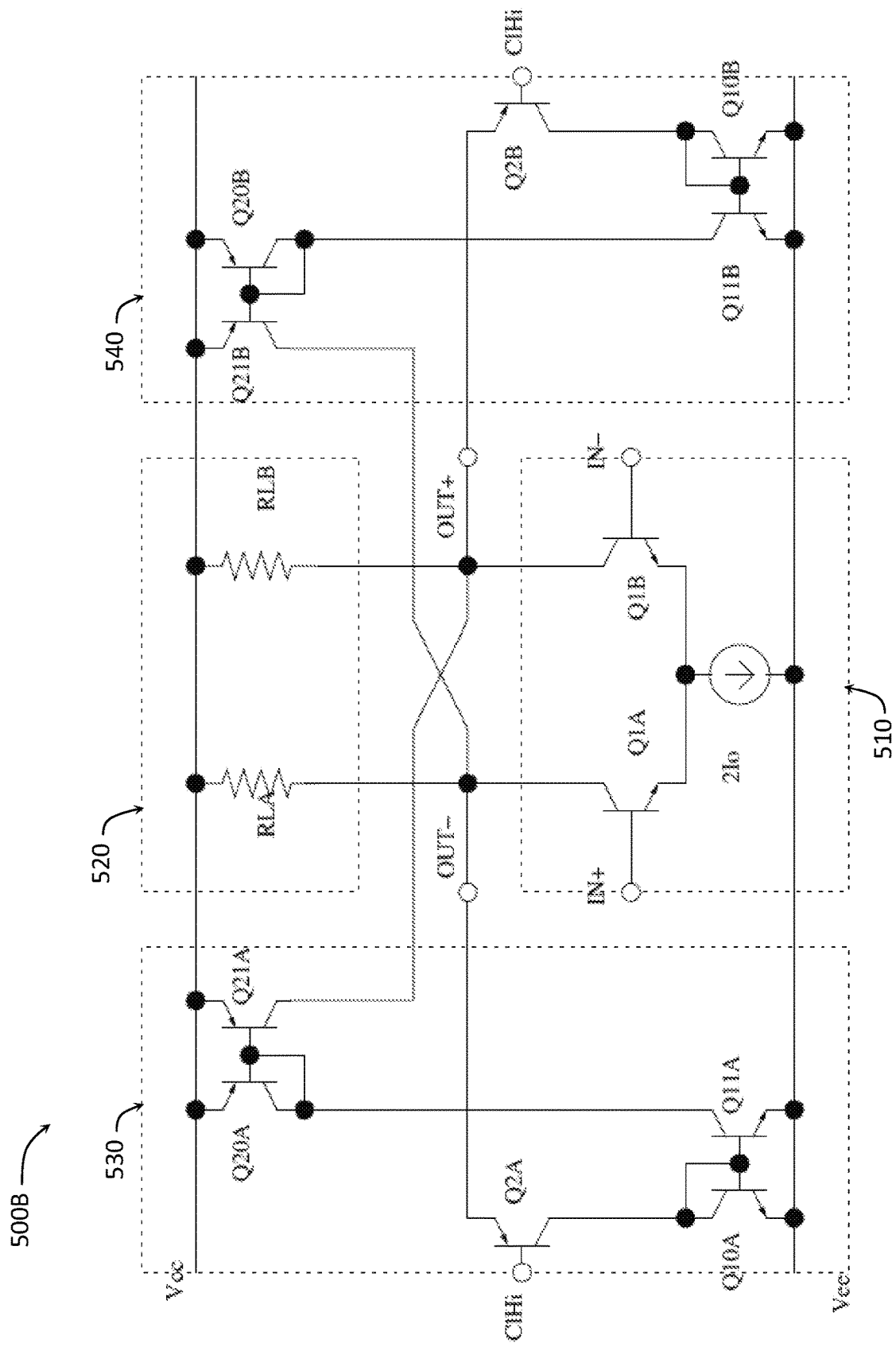
FIG. 5B is an electric circuit diagram of an output stage with a differential pair and differential clamps with only a high-side control voltage ClHi, according to some embodiments of the present disclosure.
Figure 7A:
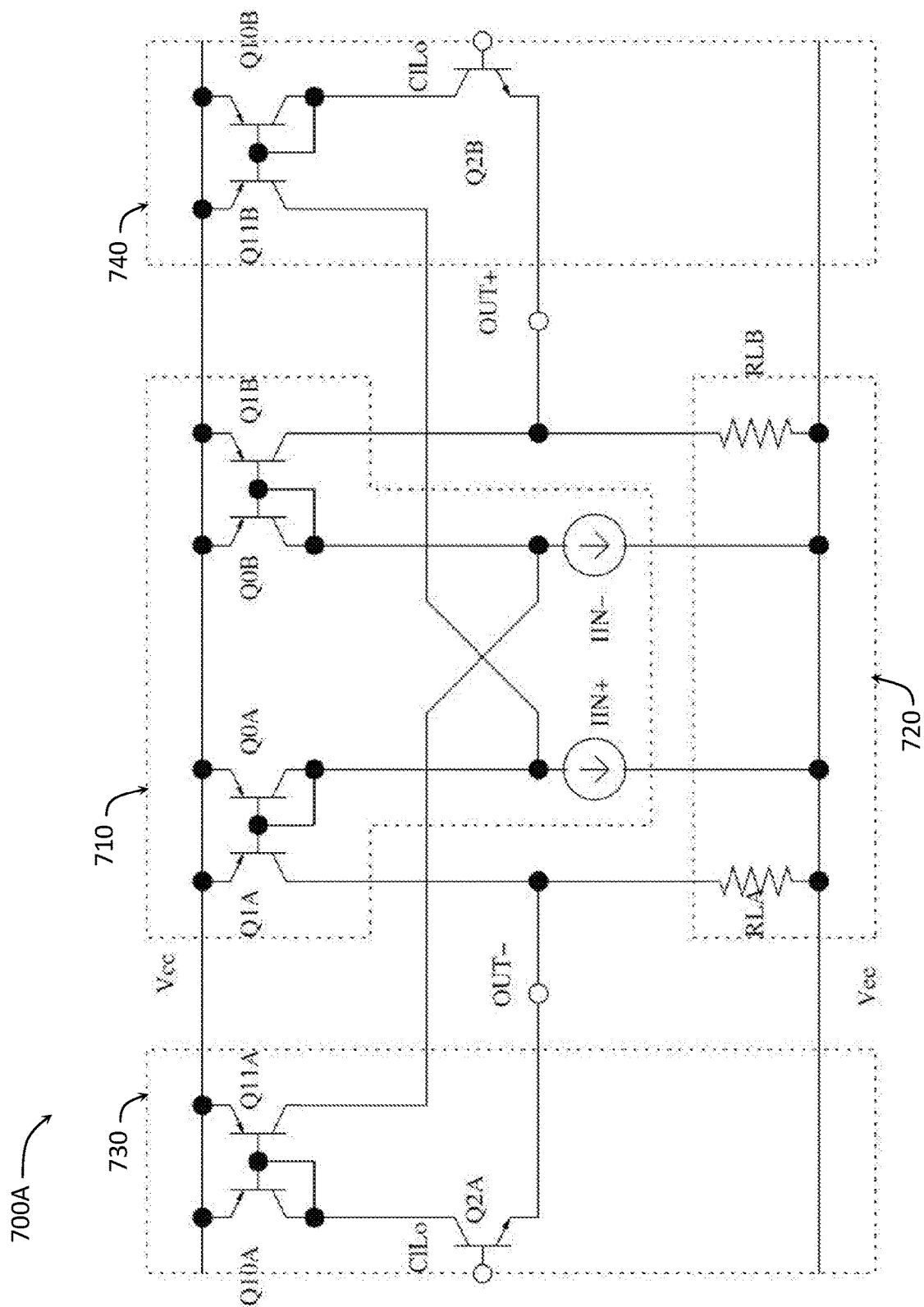
FIG. 7A is an electric circuit diagram of an output stage with a differential current mirror and differential clamps with only a low-side control voltage ClLo, according to some embodiments of the present disclosure.
Figure 7B:
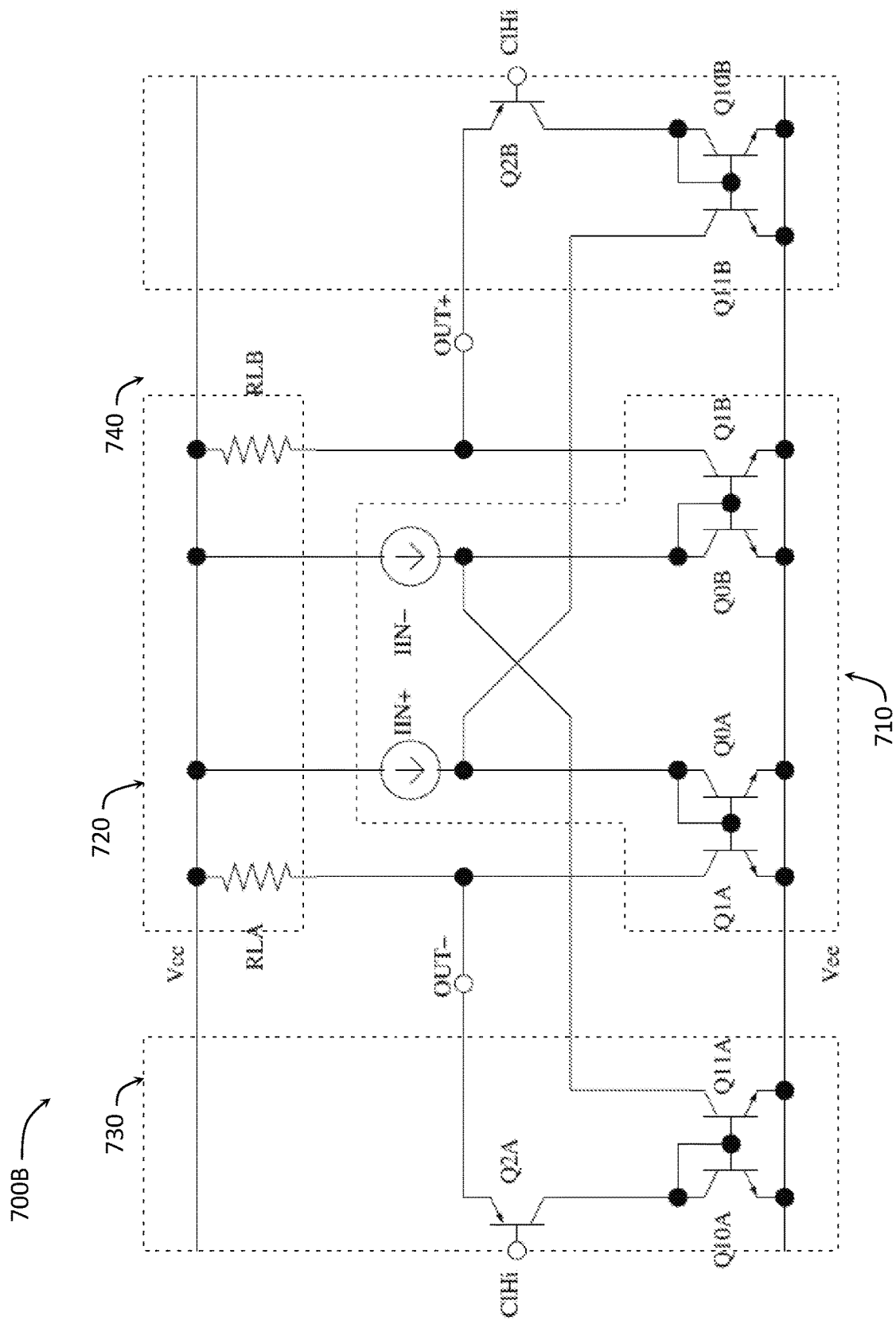
FIG. 7B is an electric circuit diagram of an output stage with a differential current mirror and differential clamps with only a high-side control voltage ClHi, according to some embodiments of the present disclosure.

As used herein, FIG. 5A and FIG. 5B may be referred to together as "FIG. 5," FIG. 7A and FIG. 7B may be referred to together as "FIG. 7," and so on. The output stages as described herein, e.g., the output stages shown in FIGS. 5, 7, 10, and 11, may advantageously present a lesser capacitive load at each output minimizing bandwidth degradation of the output stage. Furthermore, the output stages as described herein, e.g., the output stages shown in FIGS. 5, 7, 10, and 11, may advantageously use only one control signal (control voltage for the embodiments of FIGS. 5 and 7, and control current for the embodiments of FIGS. 10 and 11), making it easier to limit the output excursions symmetrically around a given (e.g., a default) common-mode voltage.

An Output Stage with a Differential Clamp Circuit with Current Recirculation and a Differential Pair According to some embodiments of the present disclosure, in an output stage with differential pairs, the current in the low-side clamp of one output may be recirculated to the other output with one additional PNP current mirror and one additional NPN current mirror, as shown with an output stage 500A illustrated in FIG. 5A.

As shown in FIG. 5A, the output stage 500A may include a differential pair 510, e.g., transistors Q1A and Q1B biased by a tail-current 2lo, and a differential load 520, e.g., resistors RLA and RLB. The output stage 500A may have additional passive and/or active components to set or regulate the outputs to a desired common-mode output voltage to match the input common-mode of the ADC. As shown in FIG. 5A, the output stage 500A illustrates a first clamp circuit 530 (encircled with a dashed contour) that is configured to implement a low-side clamp for the negative output of the output stage 500A, OUT−, and a high-side clamp for the positive output of the output stage 500A, OUT+. The output stage 500A further illustrates a circuit 540 (also encircled with a dashed contour) that is configured to implement a low-side clamp for the positive output of the output stage 500A, OUT+, and a high-side clamp for the negative output of the output stage 500A, OUT−. Together, the first clamp circuit 530 and the second clamp circuit 540 as shown in FIG. 5A may be seen as a differential clamp circuit according to some embodiments of the present disclosure. The minimum voltage at the negative output of the output stage 500A that is labeled in FIG. 5A as "OUT−" may be limited by transistor Q2A controlled by the reference voltage ClLo. The maximum voltage at the positive output of output stage 500A that is labeled in FIG. 5A as "OUT+" may be also limited also by transistor Q2A, the collector current of which is recirculated with the help of the PNP current mirror that includes an input transistor Q10A and an output transistor Q11A and with the help of the NPN current mirror that includes an input transistor Q20A and an output transistor Q21A. The minimum voltage at the positive output of the output stage 500A that is labeled in FIG. 5A as "OUT+" may be limited by transistor Q2B controlled by the reference voltage ClLo. The maximum voltage at the negative output of the output stage 500A that is labeled in FIG. 5A as "OUT−" may also be limited by transistor Q2B, the collector current of which is recirculated with the help of the PNP current mirror that includes the transistors Q10B and Q11B and with the help of the NPN current mirror that includes transistors Q20B and Q21B.

When the output voltage on one of the outputs (i.e., either the positive output OUT+ or the negative output OUT−) of output stage 500A falls below the limit set by the clamp control voltage ClLo, then the associated low-side clamp transistor (e.g., the transistor Q2A if the output of the output stage 500A for which the output voltage fell below the limit set by the ClLo is the negative output OUT−, or the transistor Q2B if the output of the output stage 500A for which the output voltage fell below the limit set by the ClLo is the positive output OUT+) of the output stage 500A will turn on. For example, the low-side clamp transistor Q2A of the output stage 500A will turn on if the output current at the output OUT− will fall short of the minimum current required to maintain the output OUT− at a minimum voltage, to make up the difference to the load 520. At the same time, the current in the same clamp transistor (i.e., the current in the low-side clamp transistor Q2A) will be recirculated to the positive output OUT+ of the output stage 500A to divert current away from the load 520 to keep the output OUT+ from exceeding a maximum voltage. In the clamp circuit arrangement shown in FIG. 5A, the low-side clamp transistor Q2B will be off when the low-side clamp transistor Q2A is on, and vice versa (i.e., when the clamp transistor Q2A of the first clamp circuit 530 is configured to conduct current, the clamp transistor Q2B of the second clamp circuit 540 is configured to not conduct current, and when the clamp transistor Q2B of the second clamp circuit 540 is configured to conduct current, the clamp transistor Q2A of the first clamp circuit 530 is configured to not conduct current). The low-side clamp transistor Q2B of the output stage 500A will turn on if the output current at the output OUT+ will fall short of the minimum current required to maintain the output OUT+ at a minimum voltage, to make up the difference to the load 520. At the same time, the current in the same clamp transistor (i.e., the current in the low-side clamp transistor Q2B) will be recirculated to the negative output OUT− of the output stage 500A to divert current away from the load 520 to keep the output OUT− from exceeding a maximum voltage. In this manner, if the differential outputs OUT+ and OUT− are symmetrical with respect to the output common-mode voltage of the differential pair 510, when one of these outputs is limited by virtue of the associated low-side clamp being triggered to turn on, the other (i.e., the out-of-phase) output will be limited by a high-side clamp realized by recirculating the current from the low-side clamp that was triggered to turn on.

Figure 6:
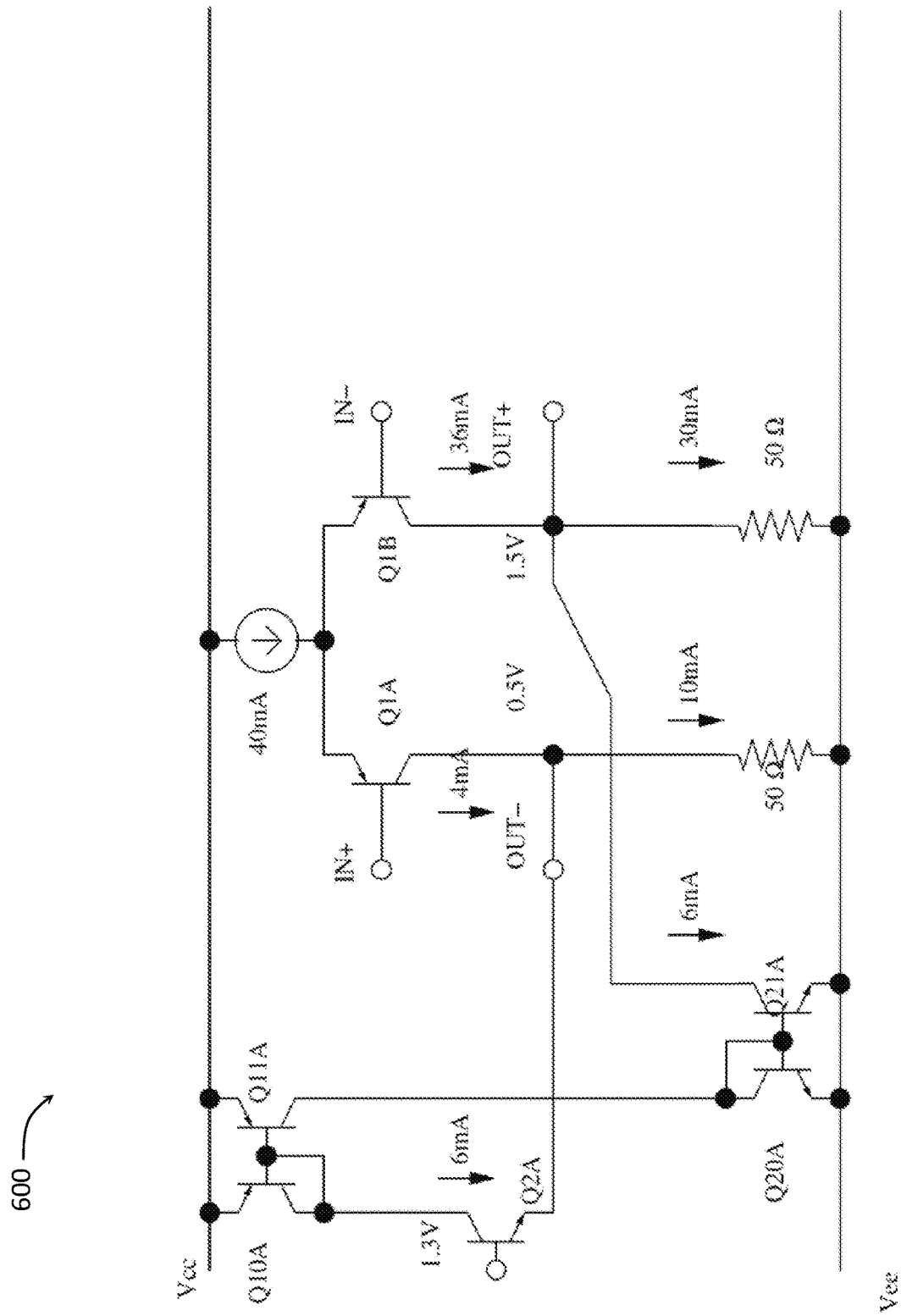
FIG. 6 is an electric circuit diagram showing example operating currents for the clamping of the output stage shown in FIG. 5A.

Operation of the clamps of the output stage 500A shown in FIG. 5A can be illustrated by an example provided in FIG. 6 that shows the clamping implemented in the output stage 500A in action. FIG. 6 is an electric circuit diagram showing example operating currents for the clamps of the output stage shown in FIG. 5A. Similar to the example of FIG. 4, the tail current 2lo in the example of FIG. 6 is assumed to be 40 mA, each of the load resistors RLA and RLB are assumed to be 50Ω, and the low-side control voltage ClLo is assumed to be 1.3V. It is further assumed that, also similar to the example of FIG. 4, in response to a differential input voltage, most of the tail current in the example of FIG. 6 is steered through transistor Q1B such that, $Ic_{Q1B}$=36 mA and $Ic_{Q1A}$=2lo−$Ic_{Q1B}$=40 mA−36 mA=4 mA. In such an example, similar to the example of FIG. 4, without any limiting by clamps, the voltage at OUT− will be 0.2V (4 mA*50Ω=0.2V) and the voltage at OUT+ will be 1.8V (36 mA*50Ω=1.8V). Further assuming that, similar to the example of FIG. 4, the base-emitter voltages ($V_{BE}$) of the transistors Q2A and Q2B in the example of FIG. 6 are $V_{BEQ2A}=V_{BEQ2B}=0.8V$, minimum output voltage in FIG. 6 will be limited to ClLo-$V_{BEQ2A}=1.3V-0.8V=0.5V$. Because in the example of FIG. 6 the voltage of the output OUT− is 0.2V, which is below 0.5V, the transistor Q2A will turn on to supply an extra current of 6 mA to keep OUT− from falling below 0.5V (0.2V+6 mA*50Ω=0.5V). The collector current of the clamp transistor Q2A is recirculated with the help of a PNP current mirror that includes transistors Q10A and Q11A, and with the help of an NPN current mirror that includes transistors Q20A and Q21A, to provide the collector current of the clamp transistor Q2A to the other differential output, OUT+, thus diverting 6 mA from the load 520 to limit the maximum voltage OUT+ to 1.5V. The extra PNP and NPN current mirrors recirculating the current from the low-side clamp at one output to the other out-of-phase output perform the same function as high-side clamp in FIG. 4, while still maintaining the output common-mode of 1.0V. Clamp transistor Q2B, PNP current mirror transistors Q10B and Q11B, and NPN current mirror transistors Q20B and Q21B that remain off have been omitted in FIG. 6.

In the arrangement of FIG. 5A, there was only one control voltage ClLo, and clamping was only triggered by the ClLo when any of the outputs fall below the limit set by the ClLo, with high-side clamp being inferred from the low-side clamp controlled by the ClLo, which allowed omitting the second control voltage, ClHi. Analogously, in some embodiments, the only control voltage used may be the high-side control voltage ClHi when any of the outputs OUT+, OUT− exceed the limit set by the ClHi, with low-side clamp being inferred from the high-side clamp controlled by the ClHi, which would allow omitting the second control voltage, which, in this case, would be ClLo. This is illustrated in FIG. 5B, providing an electric circuit diagram of an output stage 500B with a differential pair and differential clamps with only a high-side control voltage ClHi, according to some embodiments of the present disclosure. The output stage 500B is substantially analogous to the output stage 500A and may be seen as the complementary version of the output stage 500A. In particular, in FIG. 5B, each NPN transistor of FIG. 5A is replaced by a PNP transistor, each PNP transistor of FIG. 5A is replaced by an NPN transistor, and the control voltage ClLo of FIG. 5A is replaced by the control voltage ClHi (also the designation of the supply voltage, Vcc, and the ground voltage, Vee, is switched in FIG. 5B compared to FIG. 5A).

When the output voltage on one of the outputs (i.e., either the positive output OUT+ or the negative output OUT−) of output stage 500B exceeds the limit set by the clamp control voltage ClHi, then the associated high-side clamp transistor coupled to that output of the output stage 500B will turn on (e.g., the transistor Q2A if the output of the output stage 500B for which the output voltage exceeded the limit set by the ClHi is the negative output OUT−, or the transistor Q2B if the output of the output stage 500B for which the output voltage exceeded the limit set by the ClHi is the positive output OUT+). When the high-side clamp on one output of a differential output stage is engaged (i.e., is triggered or is on because the voltage at that output exceeds the maximum voltage set by the high-side clamp), a portion of the current that the clamp diverts from the load 520 may be recirculated to the other output of the differential output stage to effect a low-side clamp without the need for using a low-clamp circuit and without the need for using a control voltage ClLo. For example, the high-side clamp of the first clamp circuit 530 of the output stage 500B will turn on if the output current exceeds the maximum current allowed/established at the output OUT− at a maximum voltage (i.e., the turning on of the high-side clamp is voltage triggered), to divert current away from the load 520. At the same time, the current in the clamp transistor Q2A of the first clamp circuit 530 will be recirculated to the positive output OUT+ of the output stage 500B to make up the difference to the load 520 to keep the output OUT+ from falling below the minimum voltage. Together, the first clamp circuit 530 and the second clamp circuit 540 as shown in FIG. 5B may be seen as a differential clamp circuit according to some embodiments of the present disclosure. Similar to the clamp circuit arrangement shown in FIG. 5A, in the clamp circuit arrangement shown in FIG. 5B, the high-side clamp transistor Q2B will be off when the high-side clamp transistor Q2A is on, and vice versa (i.e., when the clamp transistor Q2A of the first clamp circuit 530 is configured to conduct current, the clamp transistor Q2B of the second clamp circuit 540 is configured to not conduct current, and when the clamp transistor Q2B of the second clamp circuit 540 is configured to conduct current, the clamp transistor Q2A of the first clamp circuit 530 is configured to not conduct current).

An Output Stage with a Differential Clamp Circuit with Current Recirculation and a Differential Current Mirror While the differential pair is one of the most common output stages, a current mirror output stage may be more preferable when output swing needs to be maximized at low supply voltages.

FIG. 7A is an electric circuit diagram of an output stage 700A with a differential current mirror 710, according to some embodiments of the present disclosure. FIG. 7A further illustrates a differential load 720, represented by resistors RLA and RLB, as well as a first clamp circuit 730 and a second clamp circuit 740. Together, the first clamp circuit 730 and the second clamp circuit 740 as shown in FIG. 7A may be seen as a differential clamp circuit according to some embodiments of the present disclosure.

As shown in FIG. 7A, the differential current mirror 710 may include two current mirrors (the first current mirror formed by an input transistor Q0A and an output transistor Q1A, and the second current mirror formed by an input transistor Q0B and an output transistor Q1B), driven, respectively, by two differential input currents IIN+ and IIN−. Currents IIN+ and IIN− may be output currents from, e.g., a differential pair, a current mirror, or any other component that can provide differential currents IIN+ and IIN−. In some embodiments, the current gain of each of the first and second current mirrors of the differential current mirror 710 may be equal to N, where N may be any positive number. A current mirror having a current gain of N means that the relationship between the input and output currents of the current mirror is Iout=N*Iin (where Iin is the input current and Iout is the output current). In general, the current gain of a current mirror may be any positive number greater than 0, which value may, but does not have to be, an integer. For the bipolar implementation embodiments (i.e., when input and output transistors of a current mirror are bipolar transistors), the value of the current gain may be indicative of (e.g., be equal to or be based on) a ratio of an area of the emitter of the output transistor to an area of the emitter of the input transistor. For the FET implementation embodiments (i.e., when input and output transistors of a current mirror are FETs), the value of the current gain may be indicative of a ratio of the aspect ratio of the output transistor to the aspect ratio of the input transistor, where an aspect ratio of a FET may be defined as a channel width of the transistor divided by its' channel length. In the embodiments where the current gain of a current mirror is greater than 0 but less than 1, multiplying the input signal by the current gain (to generate the output signal of the current mirror) means attenuating the input signal. In the embodiments where the current gain of a current mirror is greater than 1, multiplying the input signal by the current gain (to generate the output signal of the current mirror) means increasing, or gaining, the input signal. For example, in some embodiments, the ratio of the emitter area of the output transistor Q1A to the emitter area of the input transistor Q0A is N:1 and the ratio of the emitter area of the output transistor Q1B to the emitter area of the input transistor Q0B may be N:1 for a gain of N. In the present disclosure, components having the same numerals but one being denoted with a letter A and another being denoted with a letter B are assumed to be substantially identical (e.g., in terms of their dimensions and various transistor parameters), where the letters emphasize the symmetry between the left- and right-side of the circuit(s). For example, transistors Q10A and Q10B may be substantially identical to one another, transistors Q11A and Q11B may be substantially identical to one another, etc.

While FIG. 5A illustrated an example of an output stage having the differential clamps with two extra current mirrors per clamp circuit (i.e., each of the first clamp circuit 530 and the second clamp circuit 540, shown in FIG. 5A, includes two current mirrors), the output stage 700A shown in FIG. 7A includes just one extra PNP current mirror per clamp circuit, i.e., each of the first clamp circuit 730 and the second clamp circuit 740. Namely, the first clamp circuit 730 includes a current mirror formed by PNP input and output transistors Q10A and 011A and excludes the current mirror formed by the NPN input and output transistors Q20A and Q21A that were included in FIG. 5A, while the second clamp circuit 740 includes a current mirror formed by PNP input and output transistors Q10B and 011B and excludes the current mirror formed by the NPN input and output transistors Q20B and Q21B that were included in FIG. 5A.

The output stage 500A used a first current mirror formed by the PNP input and output transistors Q10A and Q11A and a second current mirror formed by the NPN input and output transistors Q20A and Q21A to recirculate the collector current of the transistor Q2A to the positive output OUT+. The output stage 700A provides a path for recirculating the collector current of the transistor Q2A to the positive output OUT+ by still using the first current mirror formed by the input and output transistors Q10A and Q11A (as was done in FIG. 5A) but, instead of using the second current mirror as was done in FIG. 5A, the output stage 700A continues the path using one of the current mirrors of the differential current mirror 710, namely, the current mirror formed by the input transistor Q0B and the output transistor Q1B. Similarly, the output stage 500A used a first current mirror formed by the input and output transistors Q10B and Q11B and a second current mirror formed by the NPN input and output transistors Q20B and Q21B to recirculate the collector current of the transistor Q2B to the negative output OUT−. The output stage 700A provides a path for recirculating the collector current of the transistor Q2B to the negative output OUT− by still using the first current mirror formed by the input and output transistors Q10B and Q11B (as was done in FIG. 5A) but, instead of using the second current mirror as was done in FIG. 5A, the output stage 700A continues the path using one of the current mirrors of the differential current mirror 710, namely, the current mirror formed by the input transistor Q0A and the output transistor Q1A. In this manner, one of the two current mirrors included in the differential current mirror 710 to provide a gain of N is re-used for recirculating the collector current from one of the clamping transistors. In some embodiments, the current mirror of any of the first clamp circuit 730 or the second clamp circuit 740 may have a gain of 1/N, i.e. an attenuation of N, to compensate for the gain N in the differential current mirror output stage. For example, considering the path for recirculating the collector current of the transistor Q2A to the positive output OUT+, as shown in FIG. 7A, when the clamp transistor Q2A is on, the collector current of the transistor Q2A undergoes is subject to the gain of 1/N by passing the first current mirror formed by the input and output transistors Q10A and Q11A, which compensates for the gain of N when the current passes the second current mirror formed by the input transistor Q0B and the output transistor Q1B, to reach the positive output OUT+. The output stage 700A may provide a more compact, faster and more power efficient differential current clamp compared to the output stage 500A, which may be desirable in some deployment scenarios. On the other hand, the output stage 500A may advantageously be less complicated compared to the output stage 700A, which may be desirable in some other deployment scenarios.

Figure 8:
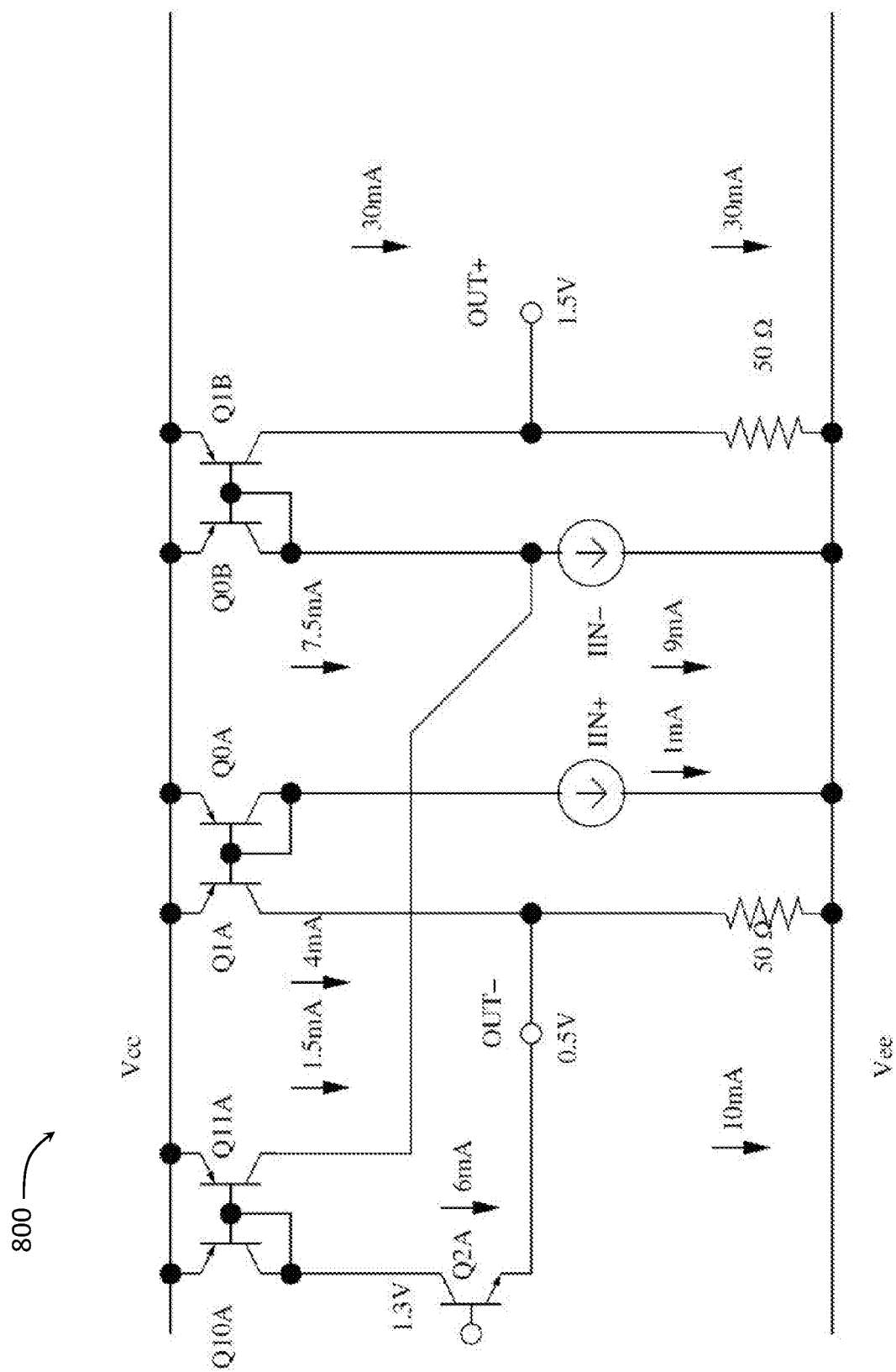
FIG. 8 is an electric circuit diagram showing example operating currents for the clamping of the output stage shown in FIG. 7A.

Clamping operation of the output stage 700A can be illustrated by an example provided in FIG. 8 that shows the clamping implemented in the output stage 700A in action. FIG. 8 is an electric circuit diagram showing example operating currents for the clamps of the output stage shown in FIG. 7A. In FIG. 8, the following is assumed: IIN+=IIN−=5 mA, RLA=RLB=50, $Ae_{Q1A}/Ae_{Q0A}=Ae_{Q1B}/Ae_{Q0B}=4$ (where, as used herein, "Ae" refers to "emitter area" of a given transistor). With these input currents, the output currents may be 20 mA, and both outputs may be nominally at 1.0V. In FIG. 8, the input currents in response to a differential current of 4 mA on each input may be set such that: IIN+=1 mA and IIN−=9 mA. If there were no clamps, with a current mirror gain of N=4, the output currents would be $Ic_{Q1B}=4*IC_{Q0B}=36$ mA and $Ic_{Q1A}=4*Ic_{Q0B}=4$ mA, and the output voltages on OUT+ and OUT− would be be 1.8V and 0.2V. However, with its base voltage at ClLo=1.3V, low-side transistor clamp Q2A will turn on to supply an extra 6 mA to limit the minimum voltage at OUT− to 0.5V. This current, as it goes through the current mirror consisting of Q10A and Q11A, will be attenuated to 1.5 mA reducing the bias current of Q0B by the same amount. This reduces the output current to 30 mA, limiting the maximum output at OUT+ to 1.5V. Clamp transistor Q2B, PNP current mirror transistors Q10B and Q11B that remain off have been omitted in FIG. 8.

In the arrangement of FIG. 7A, there was only one control voltage ClLo, and clamping was only triggered by the ClLo when any of the outputs fall below the limit set by the ClLo, with high-side clamp being inferred from the low-side clamp controlled by the ClLo, which allowed omitting the second control voltage, ClHi. Analogously, in some embodiments, the only control voltage used may be the high-side control voltage ClHi when any of the output exceed the limit set by the ClHi, with low-side clamp being inferred from the high-side clamp controlled by the ClHi, which would allow omitting the second control voltage, which, in this case, would be ClLo. This is illustrated in FIG. 7B, providing an electric circuit diagram of an output stage 700B with a differential current mirror and differential clamps with only a high-side control voltage ClHi, according to some embodiments of the present disclosure. The output stage 700B is substantially analogous to the output stage 700A and may be seen as the complementary version of the output stage 700A.

In particular, in FIG. 7B, each NPN transistor of FIG. 7A is replaced by a PNP transistor, each PNP transistor of FIG. 7A is replaced by an NPN transistor, and the control voltage ClLo of FIG. 7A is replaced by the control voltage ClHi (also the designation of the supply voltage, Vcc, and the ground voltage, Vee, is switched in FIG. 7B compared to FIG. 7A). When the output voltage on one of the outputs (i.e., either the positive output OUT+ or the negative output OUT−) of output stage 700B exceeds the limit set by the clamp control voltage ClHi, then the high-side clamp transistor of the output stage 700B will turn on. For example, a high-side clamp transistor Q2A of the output stage 700B will turn on if the output current exceeds the maximum current allowed at the output OUT− at a maximum voltage, to divert current away from the load 720. At the same time, the current in the same clamp transistor Q2A will be recirculated to the positive output OUT+ of the output stage 700B to make up the difference to the load 720 to keep the output OUT+ from falling below the minimum voltage. Together, the first clamp circuit 730 and the second clamp circuit 740 as shown in FIG. 7B may be seen as a differential clamp circuit according to some embodiments of the present disclosure.

While FIG. 5B illustrated an example of an output stage having the differential clamps with two extra current mirrors per clamp circuit (i.e., each of the first clamp circuit 530 and the second clamp circuit 540, shown in FIG. 5B, includes two current mirrors), the output stage 700B shown in FIG. 7B includes just one extra NPN current mirror per clamp circuit, i.e., each of the first clamp circuit 730 and the second clamp circuit 740. Namely, the first clamp circuit 730 of FIG. 7B includes a current mirror formed by NPN input and output transistors Q10A and 011A and excludes the current mirror formed by the PNP input and output transistors Q20A and Q21A that were included in FIG. 5B, while the second clamp circuit 740 includes a current mirror formed by NPN input and output transistors Q10B and 011B and excludes the current mirror formed by the PNP input and output transistors Q20B and Q21B that were included in FIG. 5B.

The output stage 500B used a first current mirror formed by the NPN input and output transistors Q10A and Q11A and a second current mirror formed by the PNP input and output transistors Q20A and Q21A to recirculate the collector current of the transistor Q2A to the positive output OUT+. The output stage 700B provides a path for recirculating the collector current of the transistor Q2A to the positive output OUT+ by still using the first current mirror formed by the input and output transistors Q10A and Q11A (as was done in FIG. 5B) but instead of using the second current mirror as was done in FIG. 5B the output stage 700B continues the path using one of the current mirrors of the differential current mirror 710, namely, the current mirror formed by the NPN input transistor Q0B and the NPN output transistor Q1B. Similarly, the output stage 500B used a first current mirror formed by the NPN input and output transistors Q10B and Q11B and a second current mirror formed by the PNP input and output transistors Q20B and Q21B to recirculate the collector current of the transistor Q2B to the negative output OUT−. The output stage 700B provides a path for recirculating the collector current of the transistor Q2B to the negative output OUT− by still using the first current mirror formed by the input and output transistors Q10B and Q11B (as was done in FIG. 5B) but, instead of using the second current mirror as was done in FIG. 5B, the output stage 700B continues the path using one of the current mirrors of the differential current mirror 710, namely, the current mirror formed by the input transistor Q0A and the output transistor Q1A. In this manner, in FIG. 7B, one of the two current mirrors included in the differential current mirror 710 to provide a gain of N is re-used for recirculating the collector current from one of the clamping transistors. In some embodiments, the current mirror of any of the first clamp circuit 730 or the second clamp circuit 740 of the output stage 700B may have a gain of 1/N, i.e. an attenuation of N, to compensate for the gain N in the differential current mirror output stage. For example, considering the path for recirculating the collector current of the transistor Q2A to the positive output OUT+, as shown in FIG. 7B, when the clamp transistor Q2A is on, the collector current of the transistor Q2A undergoes is subject to the gain of 1/N by passing the first current mirror formed by the input and output transistors Q10A and Q11A, which compensates for the gain of N when the current passes the second current mirror formed by the input transistor Q0B and the output transistor Q1B, to reach the positive output OUT+.

Figure 9:
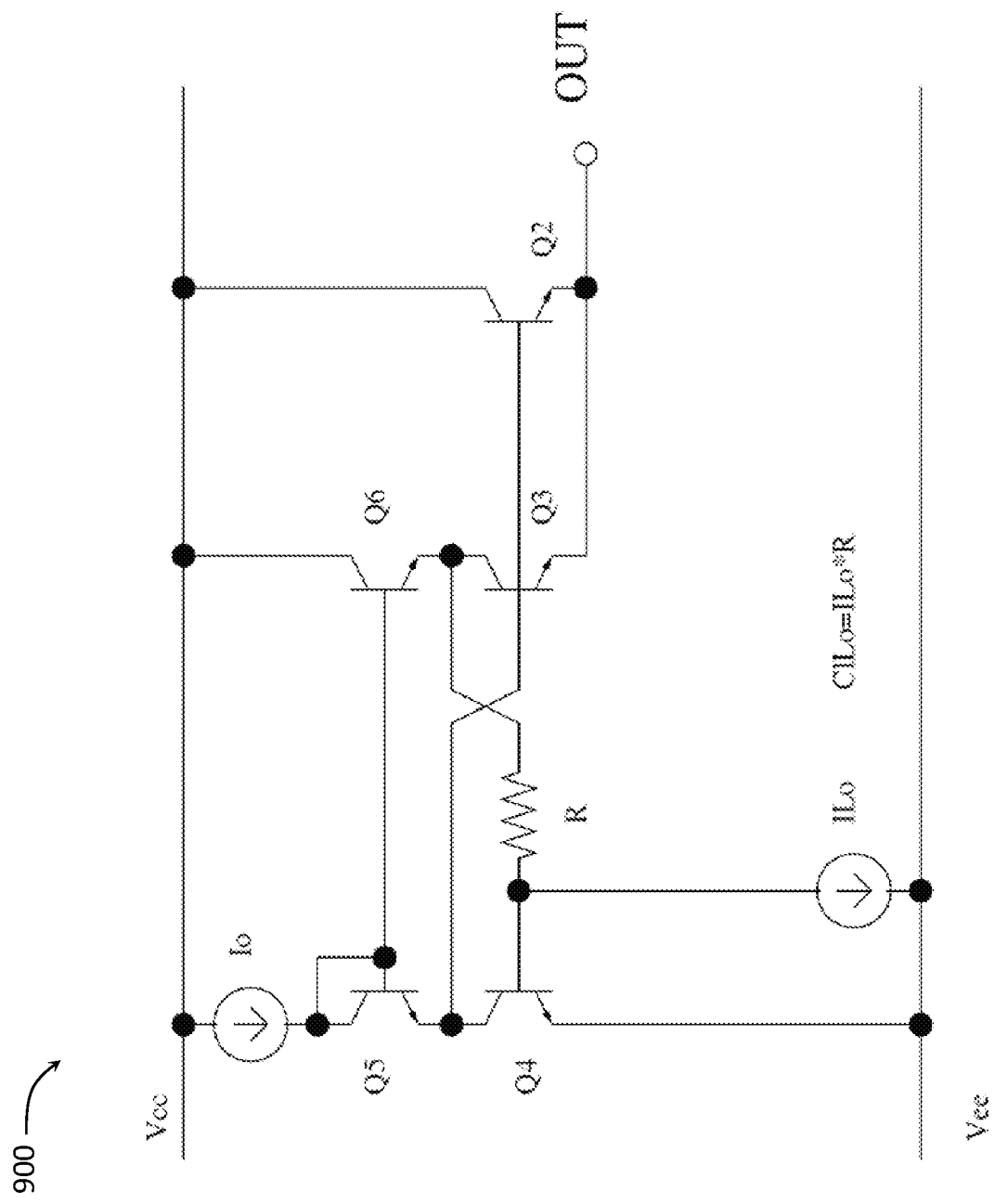
FIG. 9 is an electric circuit diagram of a current-controlled fast low-side clamp that may be used with differential clamps according to some embodiments of the present disclosure.

Variants of Output Stages with Differential Clamp Circuits with Current-Controlled Low-Side Clamps The voltage controlled low-side clamp, as implemented with transistor Q2A and Q2B as shown in FIG. 5A, although very compact and relatively easy to implement, may not be the most optimal for some deployment scenarios due to its relatively slow response and sub-optimal accuracy. For better accuracy and faster response, the voltage controlled low-side clamp of FIG. 5A may be replaced by the current controlled fast low-side clamp circuit 900 as shown in FIG. 9, the result of which replacement shown in FIG. 10A.

Figure 10A:
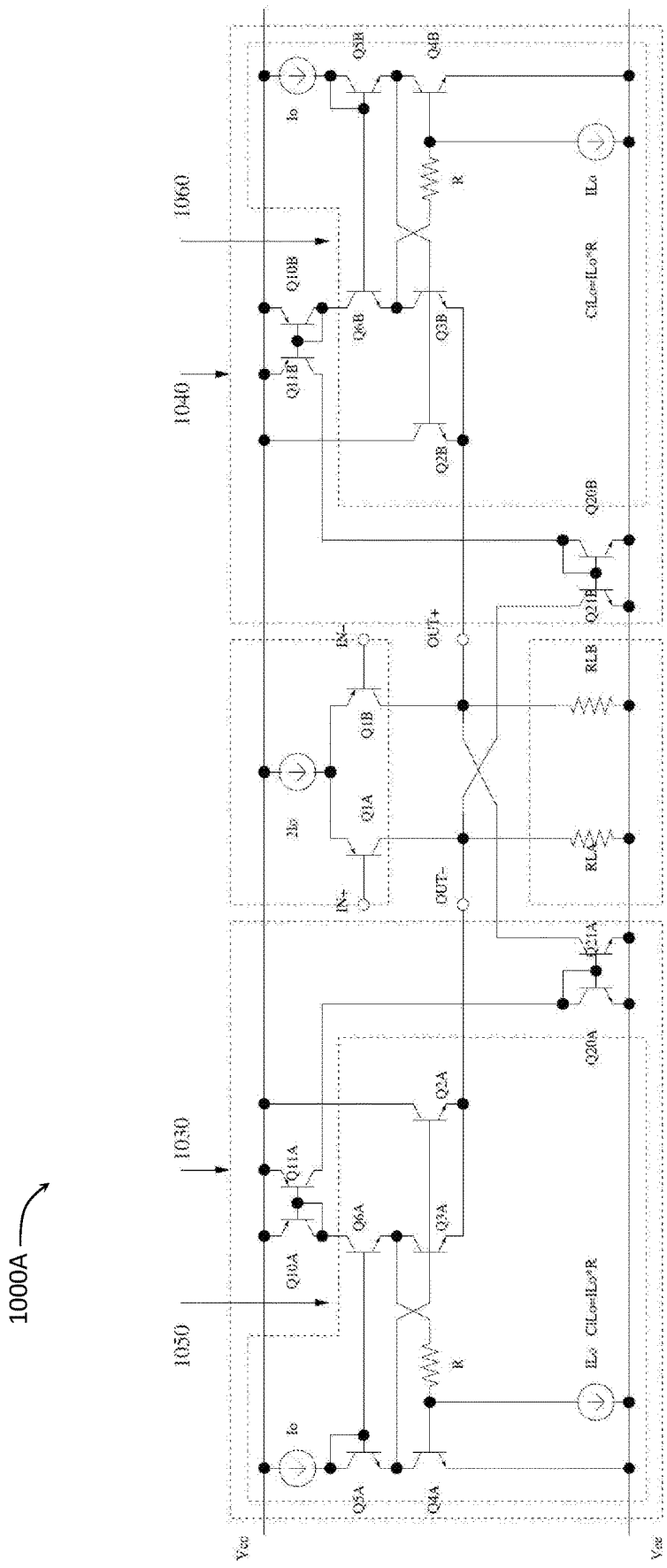
FIG. 10A is an electric circuit diagram of an output stage with a differential pair and a current controlled low-side clamp, according to some embodiments of the present disclosure.

FIG. 10A is an electric circuit diagram of an output stage 1000 with a differential pair and a current controlled low-side clamp, according to some embodiments of the present disclosure. As shown in FIG. 10A, the output stage 1000 may include a differential pair 1010, e.g., transistors Q1A and Q1B biased by a tail-current 2Io, and a differential load 1020, e.g., resistors RLA and RLB. The output stage 1000 may have additional passive and/or active components to set or regulate the outputs to a desired common-mode output voltage to match the input common-mode of the ADC. Similar to FIG. 5A, the output stage 1000 illustrates a first clamp circuit 1030 that is configured to implement a low-side clamp for the negative output of the output stage 1000, OUT− and a high-side clamp for the positive output of output stage 1000, OUT+. Also similar to FIG. 5A, the output stage 1000 further illustrates a second clamp circuit 1040 that is configured to implement a low-side clamp for the positive output of the output stage 1000, OUT+ and a high-side clamp for the negative output of output stage 1000, OUT−. As in FIG. 5A, an additional PNP current mirror (formed by the PNP transistors Q10A and Q11A for the clamp 1030 and formed by the PNP transistors Q10B and Q11B for the clamp 1040) and an additional NPN current mirror (formed by the NPN transistors Q20A and Q21A for the clamp 1030 and formed by the NPN transistors Q20B and Q21B for the clamp 1040) recirculate the current from the low-side clamp on one output to the other out-of-phase output. Together, the first clamp circuit 1030 and the second clamp circuit 1040 as shown in FIG. 10A may be seen as a differential clamp circuit according to some embodiments of the present disclosure.

In contrast to the output stage 500A shown in FIG. 5A, a single control voltage ClLo, shown in FIG. 5A, has been replaced by a single control current in the output stage 1000 of FIG. 10A, provided by a circuit 1050 for the clamp 1030 and provided by a circuit 1060 for the clamp 1040. In some embodiments, as shown in FIG. 10A, each of the circuits 1050 and 1060 may be implemented as the circuit 900 shown in FIG. 9. In some embodiments, each of the circuits 1050 and 1060 may require an additional voltage-to-current converter. The circuit 1050 may be a replacement for the transistor Q2A in FIG. 5A, while the circuit 1060 may be a replacement for the transistor Q2B in FIG. 5A. Circuit 1050 may be the low-side clamp for negative output, including single control current. Clamp 1030 includes an additional PNP current mirror (formed by transistors Q10A and Q11A) and an additional NPN current mirror (formed by transistors Q20A and Q20B) to effect high-side clamp for the positive output. Circuit 1060 is the low-side clamp for positive output, including single control current. Clamp 1040 includes an additional PNP current mirror (formed by transistors Q10B and Q11B) and an additional NPN current mirror (formed by transistors Q20B and Q21B), to effect high-side clamp for the negative output.

Figure 10B:
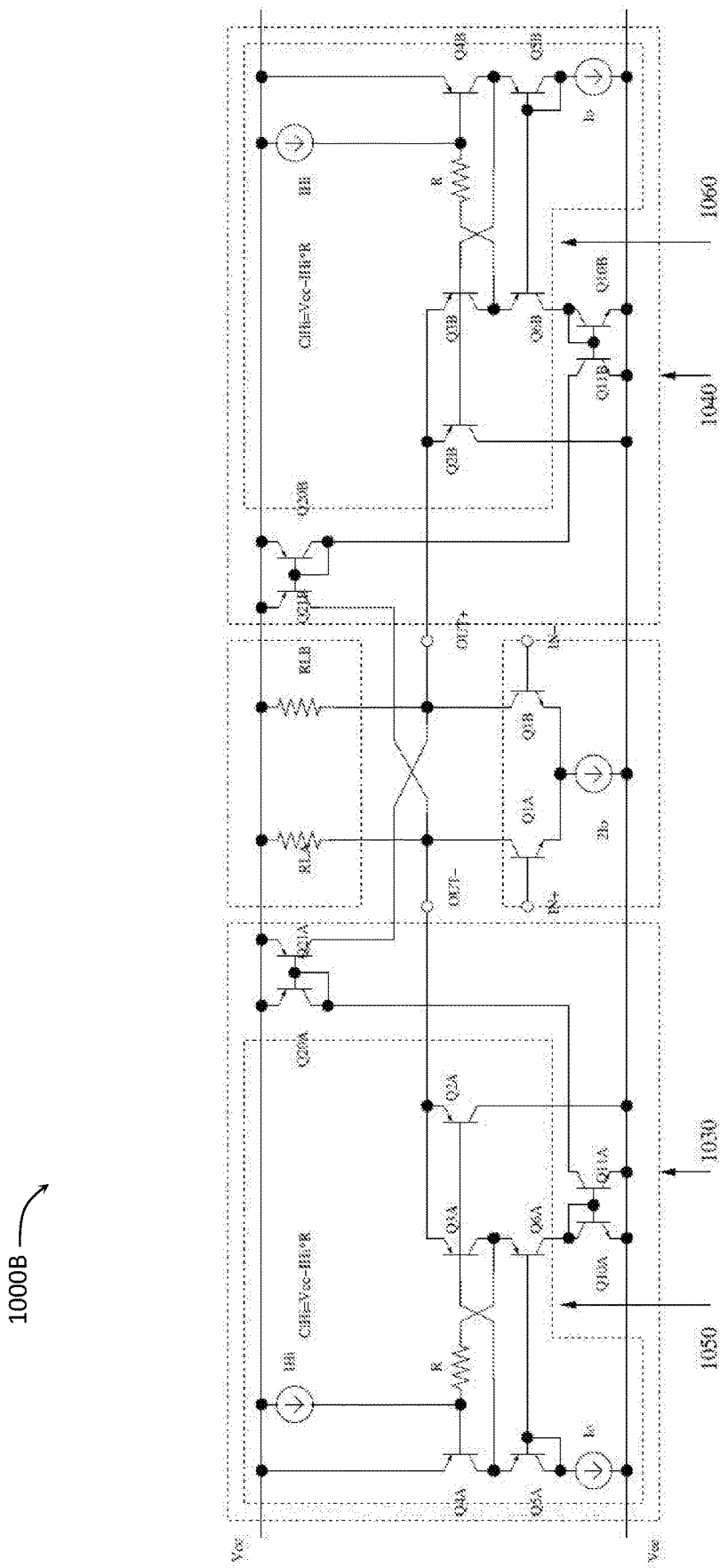
FIG. 10B is an electric circuit diagram of an output stage with a differential pair and a current controlled high-side clamp, according to some embodiments of the present disclosure.

In the arrangement of FIG. 10A, there was only one current controlled low-side clamp, with high-side clamp being inferred from the low-side clamp, which allowed omitting the second current controlled clamp, namely—the current controlled high-side clamp. Similar to how FIG. 5A was modified to result in FIG. 5B, FIG. 10A may be modified to FIG. 10B, showing an embodiment that is complementary to that shown in FIG. 10A. The output stage 1000B is substantially analogous to the output stage 1000A and may be seen as the complementary version of the output stage 1000A. In particular, in FIG. 10B, each NPN transistor of FIG. 10A is replaced by a PNP transistor, each PNP transistor of FIG. 10A is replaced by an NPN transistor, and the control current ILo of FIG. 10A is replaced by the control current IHi. Together, the first clamp circuit 1030 and the second clamp circuit 1040 as shown in FIG. 10B may be seen as a differential clamp circuit according to some embodiments of the present disclosure.

Figure 11A:
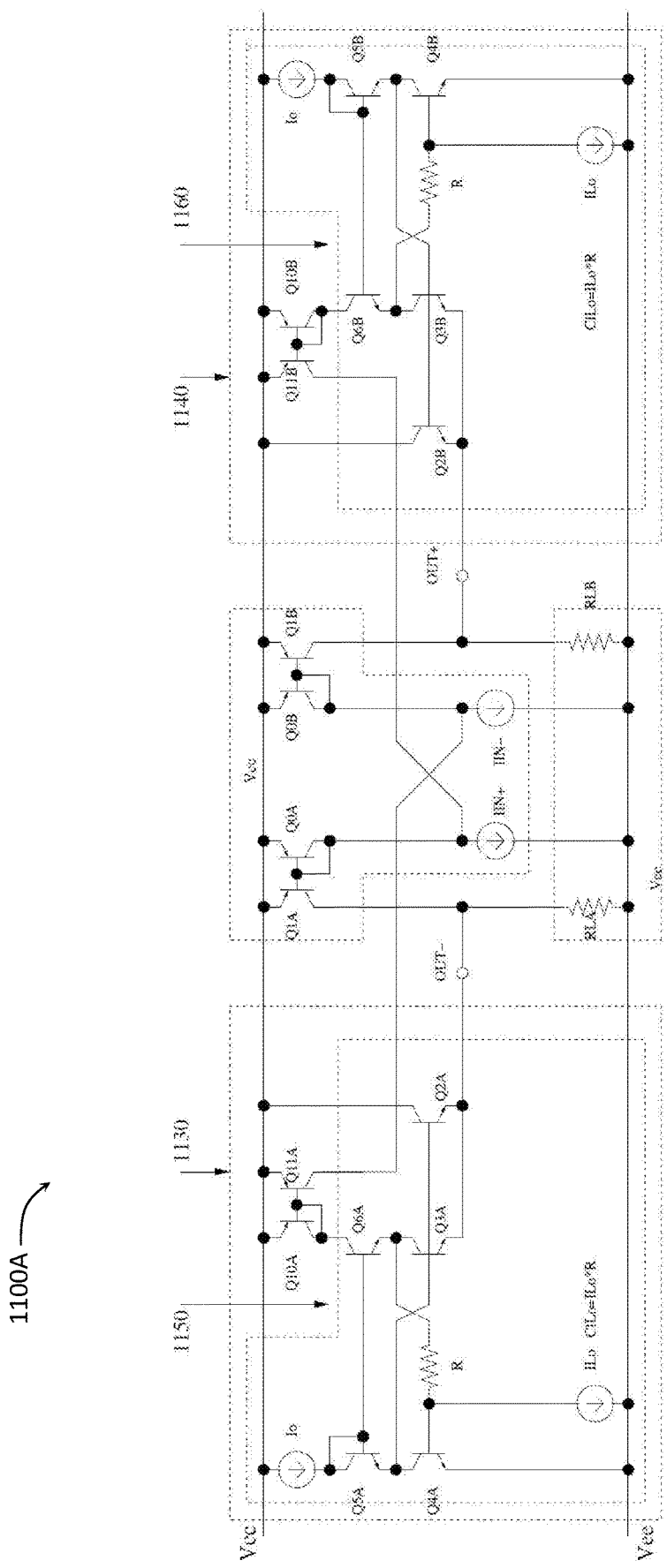
FIG. 11A is an electric circuit diagram of an output stage with a differential current mirror and a current controlled low-side clamp, according to some embodiments of the present disclosure.

Similar to the modification of FIG. 5A shown in FIG. 10A, for better accuracy and faster response, the voltage-controlled low-side clamp of FIG. 7A may be replaced by the current controlled fast low-side clamp circuit 900 as shown in FIG. 9, the result of which replacement shown in FIG. 11A.

FIG. 11A is an electric circuit diagram of an output stage 1100 with a differential current mirror and a current controlled low-side clamp, according to some embodiments of the present disclosure. As shown in FIG. 11A, the output stage 1100 may include a differential current mirror 1110, similar to the differential current mirror 710, and a differential load 1120, e.g., resistors RLA and RLB, similar to the differential load 720. The output stage 1100 may have additional passive and/or active components to set or regulate the outputs to a desired common-mode output voltage to match the input common-mode of the ADC.

In contrast to the output stage 700A shown in FIG. 7A, a single control voltage ClLo, shown in FIG. 7A, has been replaced by a single control current in the output stage 1100 of FIG. 11A, provided by a circuit 1150 for the clamp 1130 and provided by a circuit 1160 for the clamp 1140. In some embodiments, as shown in FIG. 11A, each of the circuits 1150 and 1160 may be implemented as the circuit 900 shown in FIG. 9. In some embodiments, each of the circuits 1150 and 1160 may require an additional voltage-to-current converter. The circuit 1150 may be a replacement for the transistor Q2A in FIG. 7A, while the circuit 1160 may be a replacement for the transistor Q2B in FIG. 7A. Circuit 1150 may be the low-side clamp for negative output including single control current. Clamp 1130 includes an additional current mirror (formed by transistors Q10A and Q11A) to effect high-side clamp for the positive output. Circuit 1160 is the low-side clamp for positive output, including single control current. Clamp 1140 includes an additional current mirror (formed by transistors Q10B and Q11B) to effect high-side clamp for the negative output. Together, the first clamp circuit 1130 and the second clamp circuit 1140 as shown in FIG. 11A may be seen as a differential clamp circuit according to some embodiments of the present disclosure.

Figure 11B:
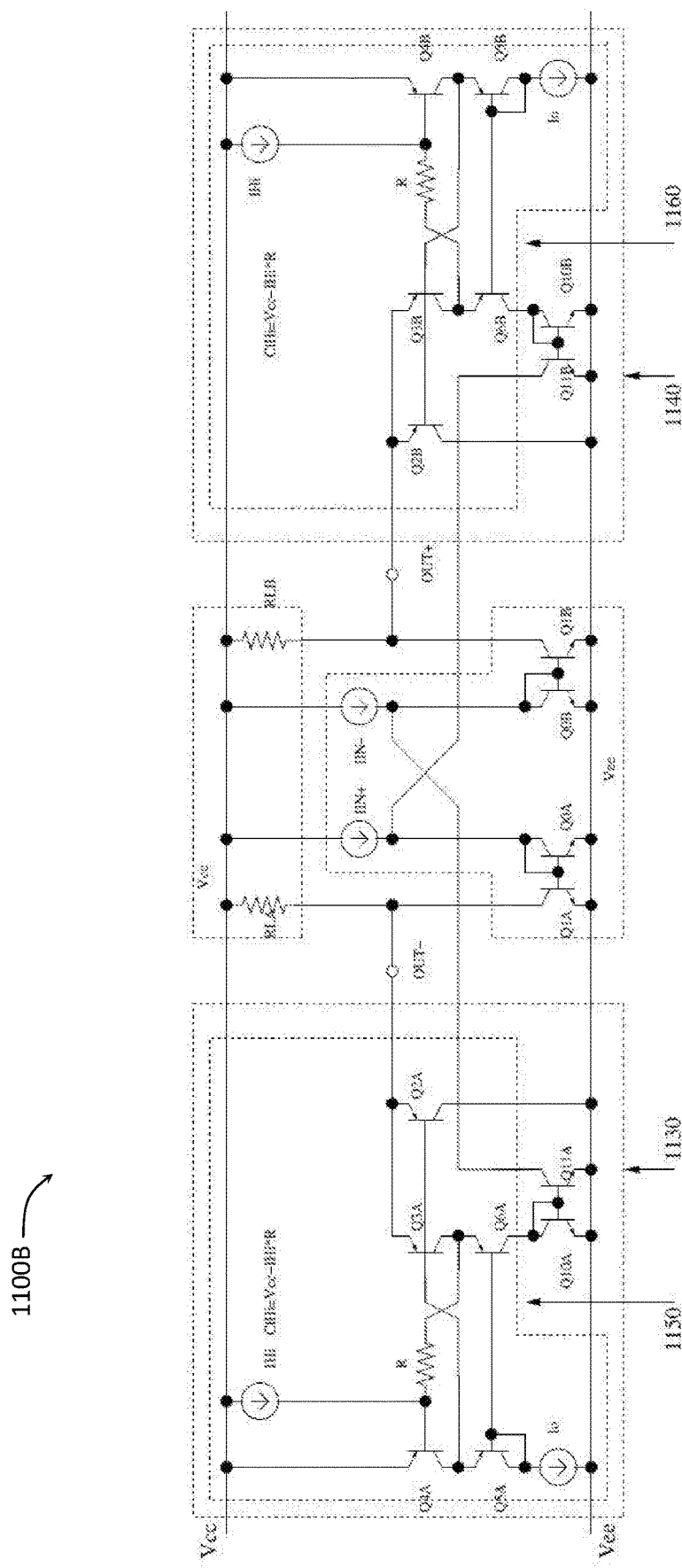
FIG. 11B is an electric circuit diagram of an output stage with a differential current mirror and a current controlled high-side clamp, according to some embodiments of the present disclosure.

In the arrangement of FIG. 11A, there was only one current controlled low-side clamp, with high-side clamp being inferred from the low-side clamp, which allowed omitting the second current controlled clamp, namely—the current controlled high-side clamp. Similar to how FIG. 7A was modified to result in FIG. 7B, FIG. 11A may be modified to FIG. 11B, showing an embodiment that is complementary to that shown in FIG. 11A. The output stage 1100B is substantially analogous to the output stage 1100A and may be seen as the complementary version of the output stage 1100A. In particular, in FIG. 11B, each NPN transistor of FIG. 11A is replaced by a PNP transistor, each PNP transistor of FIG. 11A is replaced by an NPN transistor, and the control current ILo of FIG. 11A is replaced by control current IHi. Together, the first clamp circuit 1130 and the second clamp circuit 1140 as shown in FIG. 11B may be seen as a differential clamp circuit according to some embodiments of the present disclosure.

In this disclosure, for simplicity, the differential pairs or the current mirrors have no resistors at their emitters. It should be obvious to persons of ordinary skill in the art that this does not change the operation of the disclosure. Furthermore, in some embodiments, limiter or clamps can be also implemented with discrete components external to the ADC driver.

In addition, while various embodiments of differential clamp circuits with current recirculation were described with reference to only including a single clamp transistor per differential portion, in other embodiments, the circuits described above may further include the other clamp transistor per differential portion, just in case the output stage is not driven with a differential signal (e.g., in some fault condition). For example, for the output stage 500A, shown in FIG. 5A, the circuit 530 may further include the high-clamp transistor Q3A, coupled as shown in FIG. 3 (including its coupling to the ClHi), and the circuit 540 may further include the high-clamp transistor Q3B, coupled as shown in FIG. 3 (including its coupling to the ClHi). In another example, for the output stage 500B, shown in FIG. 5B, the circuit 530 may further include the low-clamp transistor Q2A as shown in FIG. 3 (coupled to ClLo), and the circuit 540 may further include the low-clamp transistor Q2B as shown in FIG. 3 (coupled to the ClLo). In yet another example, for the output stage 700A, shown in FIG. 7A, the circuit 730 may further include the high-clamp transistor Q3A, coupled as shown in FIG. 3 (including its coupling to the ClHi), and the circuit 740 may further include the high-clamp transistor Q3B, coupled as shown in FIG. 3 (including its coupling to the ClHi).

Example Systems

Figure 12:
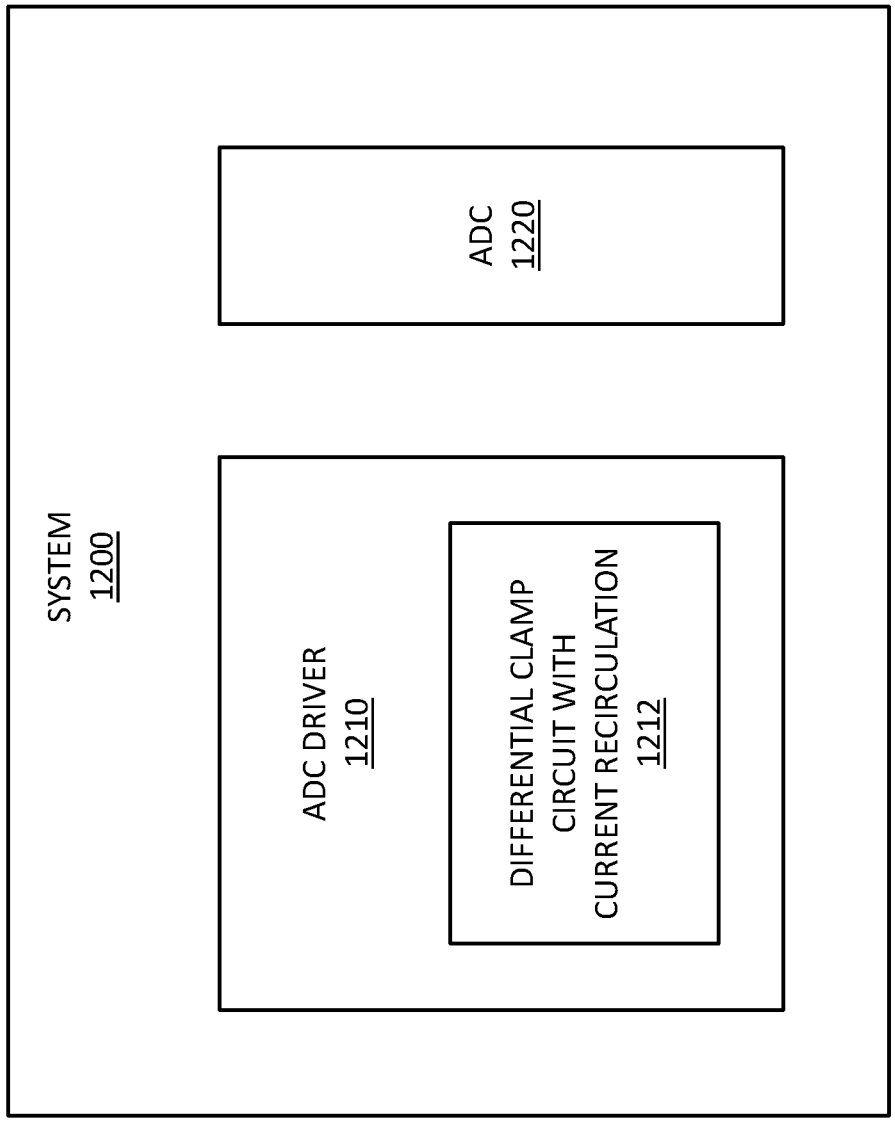
FIG. 12 is a schematic diagram of an example ADC system in which any of the differential clamp circuits with current recirculation as described herein may be implemented, according to some embodiments of the present disclosure.

Various embodiments of differential clamp circuits with current recirculation as described above may be implemented in any kind of system where clamping of differential signals may be used. One example of such a system is shown in FIG. 12, providing a schematic illustration of a system 1200 implementing a differential clamp circuit 1212, according to some embodiments of the disclosure. As shown in FIG. 12, the system 1200 may include an ADC driver 1210 and an ADC 1220. The ADC driver 1210 may be used to provide drive signals to drive the ADC 1220 so that the ADC 1220 can translate analog electrical signals to digital form, e.g., for data processing purposes. In particular, the ADC driver 1210 may include the differential clamp circuit 1212 which can be implemented according to any embodiments of differential clamp circuits with current recirculation, described above. For example, the differential clamp circuit 1212 may be implemented as the differential clamp circuit 500A, 500B, 700A, 700B, 1000A, 1000B, 1100A, or 1100B, or as any further embodiments of these differential clamp circuits, as described above. The ADC driver 1210 may then generate drive signals based on the output signal(s) generated by the differential clamp circuit 1212. In various embodiments, the drive signals generated by the ADC driver 1210 may be used to drive a differential input of the ADC 1220.

In various embodiments, the drive signal generated by the ADC driver 1210 may realize/implement functions such as buffering, amplitude scaling, single-ended-to-differential and differential-to-single-ended conversion, common-mode offset adjustment, and filtering. In other words, the ADC driver 1210 may act as a signal conditioning element in a data conversion stage and may be a key factor in enabling the ADC 1220 to achieve its desired performance. The ADC 1220 may be any type of ADC, such as, but not limited to, a successive approximation register (SAR) converter, a pipeline converter, a flash converter, or a sigma-delta converter.

As described above, differential clamp circuits with current recirculation may be used in LIDAR systems. LIDAR refers to a surveying method that measures distance to a target object by illuminating the object with light (e.g., with pulses of light) and measuring the reflected light with a sensor. Differences in laser return times and wavelengths can then be used to determine the distance to the object and/or make digital three-dimensional representations of the object. LIDAR systems are used in a variety of situations. For example, LIDAR systems can be used with airplanes, automobiles, binoculars or monoculars, etc.

Figure 13:
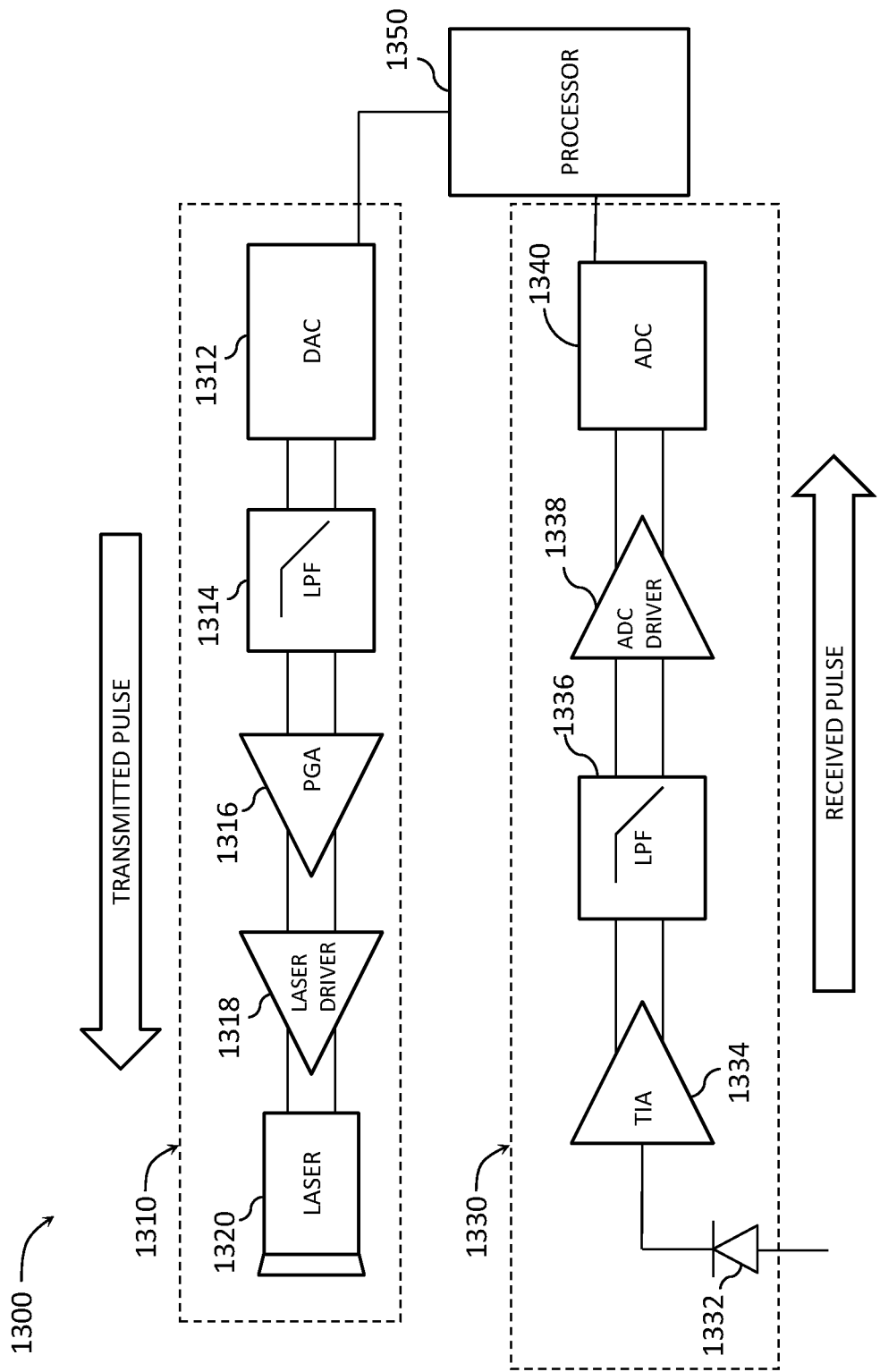
FIG. 13 is a schematic diagram of an example LIDAR system in which any of the differential clamp circuits with current recirculation as described herein may be implemented, according to some embodiments of the present disclosure.

FIG. 13 is a block diagram of an example laser range finding, e.g., LIDAR, system 1300 according to some embodiments of the present disclosure. The LIDAR system 1300 is an example system that can include differential clamp circuits with current recirculation, as described herein. As shown in FIG. 13, system 1300 may include a transmitter signal chain 1310, a receiver signal chain 1330, a processor 1350, and a controller 1360. In some instances, the receiver signal chain 1330 can be implemented separately from the transmitter signal chain 1310. As shown in FIG. 13, the transmitter signal chain 1312 may include a digital-to-analog converter (DAC) 1312, a low pass filter (LPF) 1314, a programmable gain amplifier (PGA) 1316, a laser driver 1318, and a laser 1320. The receiver chain 1330 may include an optical sensor, e.g., a photodiode (PD) 1332, a transimpedance amplifier (TIA) 1334, an LPF 1336, an analog-to-digital converter (ADC) driver 1338, and an ADC 1340. In some instances, a receiver chain can include a PGA coupled between the TIA 1334 and the LPF 1336. Such a PGA could be implemented in place of or in addition to the ADC driver 1338.

The processor 1350 may be configured to generate a digital signal indicating that a laser pulse is to be emitted by the laser 1320. The digital signal from the processor 1350 may then be converted to an analog signal by the DAC 1312, further processed by the optional LPF 1314, amplified by the PGA 1316, and provided to the laser driver 1318. The laser 1320 may be, e.g., a laser diode.

The light emitted by the laser 1320 can reach an object or a target and reflected light can be received by the optical sensor 1332 of the receiver signal chain 1330. Thus, the reflected light can be detected at the optical sensor 1332. The optical sensor 1332 can be an avalanche photodiode (APD), for example. The optical sensor 1332 can generate a current pulse indicative of the received reflected light and the current pulse may be converted to a voltage pulse by the TIA 1334 and, optionally, further processed by the LPF 1336. The LPF 1336 can be a tunable filter in certain embodiments. As illustrated, the LPF 1336 may be coupled in a signal path between the TIA 1334 and the ADC driver 1338. In some other implementations, the LPF 1336 can be coupled in a signal path between the ADC driver 1338 and the ADC 1340. The ADC driver 1338 generate a drive signal, based on the output of the TIA 1334, to drive the ADC 1340. Any of the differential clamp circuits with current recirculation, as described herein, may be implemented within, or associated with the ADC driver 1338. The ADC 1340 can convert the received drive signal to a digital signal, to further be processed by the processor 1350.

In some embodiments, the processor 1350 can be a hardware processor. In some embodiments, the processor 1350 can be a baseband digital signal processor. In some embodiments, the processor 1350 can determine a distance between an object and the laser range finding system 1300. In some embodiments, the processor 1350 can output a signal indicative of the determined distance. In some embodiments, the processor 1350 can identify an object from which the pulse of light reflected from the object based at least partly on the width of a pulse generated by the TIA 1334. In some embodiments, the processor 1350 can output data identifying the object. In some embodiments, one instance of the processor 1350 may be associated with the receiver signal chain 1330 and another instance of the processor 1350 may be associated with the transmitter signal chain 1310.

Figure 14:
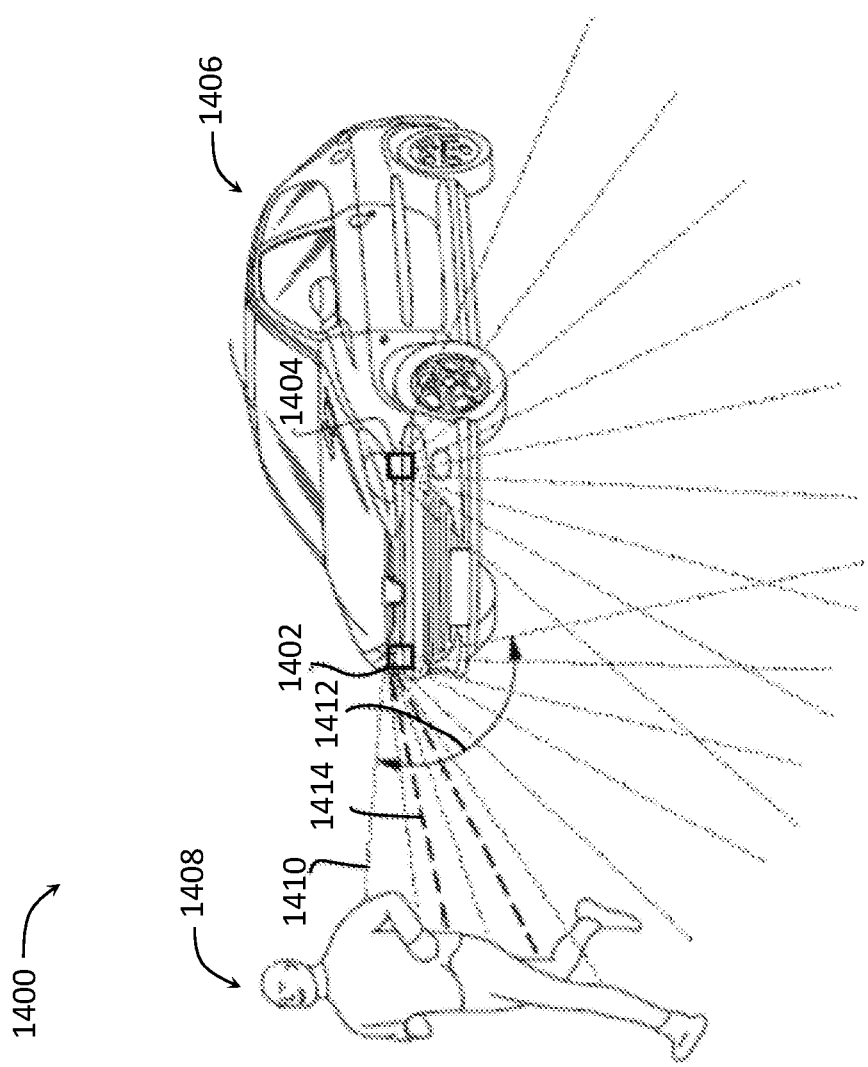
FIG. 14 is an illustration of a LIDAR system integrated with an automobile, according to some embodiments of the present disclosure.

FIG. 14 shows a LIDAR system integrated with an automobile. This is an example application in which differential clamp circuits with current recirculation as described herein can be implemented. FIG. 14 illustrates two LIDAR systems 1402 and 1404 integrated with an automobile 1406. The first LIDAR system 1402 may be positioned near a right headlight of the automobile 1406 and the second LIDAR system 1404 may be positioned near the left headlight of automobile 1406. The LIDAR systems 1402 and/or 1404 can implement any suitable principles of the differential clamp circuits with current recirculation, as discussed herein. The LIDAR systems 1402 and/or 1404 can detect a distance between the automobile 1406 and an object 1408.

As illustrated, a transmitter of the LIDAR system 1402 can transmit pulses of light 1410 at an angle 1412. At least some of the pulses of light 1410 may be generated by a laser diode, e.g., the laser 1320, shown in FIG. 13. The transmitted light 1410 can travel through the air and reach the object 1408. The object 1408 can reflect back pulses of light 1414 to a receiver of the LIDAR system 1402. Embodiments discussed herein can generate information to identify the object 1408. The pulses of light 1410 can be transmitted three dimensionally to obtain three dimensional information of the surroundings.

One or more additional LIDAR systems can be integrated with the automobile 1406 to cover a wider range of area for detection and/or to obtain additional information regarding a selected area. In some embodiments, data collected by each LIDAR system can be combined to analyze information from a wider range of area and/or to provide additional information about a selected area. In some embodiments, the angle 1412 can be adjusted and the angle 1412 can be in any suitable range.

The illustrations of FIGS. 12-14 provide just some non-limiting example where differential clamp circuits with current recirculation as described herein may be used. Various teachings related to differential clamp circuits with current recirculation as described herein are applicable to a large variety of other systems. In some scenarios, various embodiments of differential clamp circuits with current recirculation as described herein can be used in automotive systems, safety-critical industrial applications, medical systems, scientific instrumentation, wireless and wired communications, radar, industrial process control, audio and video equipment, current sensing, instrumentation (which can be highly precise), and various digital-processing-based systems. In other scenarios, various embodiments of differential clamp circuits with current recirculation as described herein can be used in the industrial markets that include process control systems that help drive productivity, energy efficiency, and reliability. In yet further scenarios, various embodiments of differential clamp circuits with current recirculation may be used in consumer applications.

Select Examples

The following paragraphs provide examples of various ones of the embodiments disclosed herein.

Example A1 provides a differential clamp circuit, comprising a current circulator.

Example A2 provides an output stage comprising a differential clamp with a current circulator.

Example A3 provides the output stage according to example A2, wherein the output stage includes coupling between components as shown in FIG. 5.

Example A4 provides the output stage according to example A2, wherein the output stage includes coupling between components as shown in FIG. 7.

Example A5 provides the output stage according to example A2, wherein the output stage includes coupling between components as shown in FIG. 10.

Example A6 provides the output stage according to example A2, wherein the output stage includes coupling between components as shown in FIG. 11.

Example A7 provides an electronic component comprising a differential clamp circuit and/or an output stage according to any one of the preceding examples.

Example A8 provides the electronic component according to example A7, wherein the electronic component is an ADC driver.

Example A9 provides the electronic component according to example A7, wherein the electronic component is a LIDAR receiver.

Example B1 provides a system configured to clamp a differential signal that is output by an electronic component. The system includes a clamp circuit that has a first portion and a second portion. Each of the portions of the clamp circuit is coupled to a respective (i.e., different) output of the differential signal (e.g., the first portion is coupled to an output OUT−, while the second portion is coupled to an output OUT+, described herein). Furthermore, each of the portions of the clamp circuit includes a clamp transistor, coupled to a control signal that sets one of a minimum voltage value or a maximum voltage value for the output coupled to the portion, and a current mirror, having an input transistor and an output transistor. Still further, for each of the portions of the clamp circuit, a first terminal (e.g., emitter) of the clamp transistor is coupled to the output coupled to the portion, a second terminal (e.g., collector) of the clamp transistor is coupled to the input transistor of the current mirror, and the output transistor of the current mirror is coupled to the output coupled to the other portion.

Example B1 is general to various embodiments of differential clamp circuits with current recirculation as described herein. The terms "first portion" and "second portion" in example B1 refer to the clamp circuits X30 and X40, respectively, where X is 5 for the embodiments described with reference to FIGS. 5A-5B, is 7 for the embodiments described with reference to FIGS. 7A-7B, 10 for the embodiments described with reference to FIGS. 10A-10B, and 11 for the embodiments described with reference to FIGS. 11A-11B. Thus, the "first portion" of example B1 may be any of the circuits described herein as the "first clamp circuit," while the "second portion" of example B1 may be any of the circuits described herein as the "second clamp circuit."

For the embodiments described with reference to FIGS. 5A-5B and FIGS. 7A-7B, the term "clamp transistor" in example B1 may, e.g., refer to the transistor Q2A for the clamp transistor of the first portion, and the transistor Q2B for the clamp transistor of the second portion.

For the embodiments described with reference to FIGS. 5A-5B, FIGS. 7A-7B, FIGS. 10A-10B, and FIGS. 11A-11B, the "current mirror" in example B1 may, e.g., refer to the current mirror formed by the input transistor Q10A and the output transistor Q11A for the current mirror of the first portion, and the current mirror formed by the input transistor Q10B and the output transistor Q11B for the current mirror of the second portion.

Example B2 provides the system according to example B1, where the current mirror is a first current mirror, each of the portions of the clamp circuit further includes a second current mirror, having an input transistor and an output transistor, and for each of the portions of the clamp circuit the output transistor of the first current mirror is coupled to the output coupled to the other portion by having the output transistor of the first current mirror being coupled to the input transistor of the second current mirror and having the output transistor of the second current mirror being coupled to the output coupled to the other portion.

For the embodiments described with reference to FIGS. 5A-5B and FIGS. 10A-10B, the "second current mirror" in example B2 may, e.g., refer to the current mirror formed by the input transistor Q20A and the output transistor Q21A for the current mirror of the first portion, and the current mirror formed by the input transistor Q20B and the output transistor Q21B for the current mirror of the second portion.

For the embodiments described with reference to FIGS. 7A-7B and FIGS. 11A-11B, the "second current mirror" in example B2 may, e.g., refer to the current mirror formed by the input transistor Q0B and the output transistor Q1B for the current mirror of the first portion, and the current mirror formed by the input transistor Q0A and the output transistor Q1A for the current mirror of the second portion.

Example B3 provides the system according to example B2, where the differential signal is output by a differential current mirror of the electronic component, the differential current mirror includes a first current mirror portion and a second current mirror portion, each including a respective (i.e., different) current mirror, an output transistor of the current mirror of the first current mirror portion (e.g., the output transistor Q1A) is coupled to the output coupled to the first portion of the clamp circuit (e.g., the output OUT−), an output transistor of the current mirror of the second current mirror portion (e.g., the output transistor Q1B) is coupled to the output coupled to the second portion of the clamp circuit (e.g., the output OUT+), the second current mirror of the first portion of the clamp circuit is the current mirror of the second current mirror portion (e.g., the current mirror formed by the input transistor Q0B and the output transistor Q1B), and the second current mirror of the second portion of the clamp circuit is the current mirror of the first current mirror portion (e.g., the current mirror formed by the input transistor Q0A and the output transistor Q1A).

Example B4 provides the system according to example B3, where, for each of the portions of the clamp circuit, a current gain of the second current mirror is inversely proportional to a current gain of the first current mirror. For example, if the current gain of the second current mirror is N, then the current gain of the first current mirror may be 1/N, where N is a positive number greater than zero.

Example B5 provides the system according to any one of examples B1-B4, where the control signal is a control voltage signal, and the control voltage signal sets the minimum voltage value.

Example B6 provides the system according to example B5, where, for each of the portions of the clamp circuit the clamp transistor is an N-type transistor (e.g., the transistor Q2A for the first portion and the transistor Q2B for the second portion for any of the embodiments described with reference to FIGS. 5A and 7A), and each of the input and the output transistors of the current mirror is a P-type transistor.

Example B7 provides the system according to any one of examples B1-B4, where the control signal is a control voltage signal, and the control voltage signal sets the maximum voltage value.

Example B8 provides the system according to example B7, where, for each of the portions of the clamp circuit, the clamp transistor is a P-type transistor (e.g., the transistor Q2A for the first portion and the transistor Q2B for the second portion for any of the embodiments described with reference to FIGS. 5B and 7B), and each of the input and the output transistors of the current mirror is an N-type transistor.

Example B9 provides the system according to any one of examples B1-B4, where the control signal is a control current signal, and the control current signal sets the minimum voltage value.

Example B10 provides the system according to example B9 where, for each of the portions of the clamp circuit, the clamp transistor is an N-type transistor (e.g., the transistor Q3A or the transistor Q6A for the first portion and the transistor Q3B or the transistor Q6B for the second portion for any of the embodiments described with reference to FIGS. 10A and 11A), and each of the input and the output transistors of the current mirror is a P-type transistor.

Example B11 provides the system according to any one of examples B1-B4, where the control signal is a control current signal, and the control current signal sets the maximum voltage value.

Example B12 provides the system according to example B11 where, for each of the portions of the clamp circuit, the clamp transistor is a P-type transistor (e.g., the transistor Q3A or the transistor Q6A for the first portion and the transistor Q3B or the transistor Q6B for the second portion for any of the embodiments described with reference to FIGS. 10B and 11B) and each of the input and the output transistors of the current mirror is an N-type transistor.

Example B13 provides the system according to any one of the preceding examples B, where, when the clamp transistor of the first portion is configured to conduct current, the clamp transistor of the second portion is configured to not conduct current, and, when the clamp transistor of the second portion is configured to conduct current, the clamp transistor of the first portion is configured to not conduct current.

Example B14 provides the system according to any one of the preceding examples B, where the system is a driver for an analog-to-digital converter.

In a further example, the system according to any one of the preceding examples B may be a LIDAR system.

Example B15 provides a clamp circuit configured to limit voltage on a first and a second outputs of a differential signal, the clamp circuit including a first and a second current mirrors, and a first and a second clamp transistors. In such a circuit, a first terminal (e.g., emitter) of the first clamp transistor is coupled to the first output, a second terminal (e.g., collector) of the first clamp transistor is coupled to an input of the first current mirror, a third terminal (e.g., base) of the first clamp transistor is coupled to a control signal that sets one of a minimum voltage value or a maximum voltage value for the first output, an output of the first current mirror is coupled to the second output, a first terminal (e.g., emitter) of the second clamp transistor is coupled to the second output, a second terminal (e.g., collector) of the second clamp transistor is coupled to an input of the second current mirror, a third terminal (e.g., base) of the second clamp transistor is coupled to a control signal that sets one of a minimum voltage value or a maximum voltage value for the second output, and an output of the second current mirror is coupled to the first output.

Example B16 provides the clamp circuit according to example B15, further including a third and a fourth current mirrors, where the output of the first current mirror is coupled to the second output by having the output of the first current mirror coupled to an input of the third current mirror, and having an output of the third current mirror coupled to the second output, and the output of the second current mirror is coupled to the first output by having the output of the second current mirror coupled to an input of the fourth current mirror, and having an output of the fourth current mirror coupled to the first output.

Example B17 provides a system configured to limit voltages on a first and a second outputs of a differential signal. The system includes a clamp circuit, coupled to a control signal that sets a first voltage value for the first output. The clamp circuit is configured to, when triggered to clamp a voltage on the first output to the first voltage value, clamp the voltage on the first output to the first voltage value, and clamp a voltage on the second output to a second voltage value, where the second voltage value is based on the first voltage value.

Example B18 provides the system according to example B17, where the first voltage value is a minimum voltage value and the clamp circuit is triggered to clamp the voltage on the first output to the first voltage value when the voltage on the first output falls below the first voltage value, by increasing the voltage (e.g., by increasing the current) on the first output by a clamp amount, and the clamp circuit is triggered to clamp the voltage on the second output to the second voltage value by decreasing the voltage (e.g., by decreasing the current) on the second output by the clamp amount.

Example B19 provides the system according to example B17, where the first voltage value is a maximum voltage value and the clamp circuit is triggered to clamp the voltage on the first output to the first voltage value when the voltage on the first output exceeds the first voltage value, by decreasing the voltage on the first output by a clamp amount, and the clamp circuit is triggered to clamp the voltage on the second output to the second voltage value by increasing the voltage on the second output by the clamp amount.

Example B20 provides the system according to any one of examples B17-B19, where the first voltage value and the second voltage value are symmetric with respect to a common-mode voltage of the differential signal (in other words, the average of the first and second voltage values is equal to the common-mode voltage of the differential signal).

Example B21 provides a method for enabling clamping of a differential signal that is output by an electronic component. The method includes providing a clamp circuit, the clamp circuit including a first portion and a second portion, each of the portions coupled to a respective (i.e., different) output of the differential signal (e.g., the first portion is coupled to an output OUT−, while the second portion is coupled to an output OUT+, described herein) and including a clamp transistor, coupled to a control signal that sets one of a minimum voltage value or a maximum voltage value for the output coupled to the portion, and a current mirror, having an input transistor and an output transistor. For each of the portions of the clamp circuit, a first terminal (e.g., emitter) of the clamp transistor is coupled to the output coupled to the portion, a second terminal (e.g., collector) of the clamp transistor is coupled to the input transistor of the current mirror, and the output transistor of the current mirror is coupled to the output coupled to the other portion.

Example B22 provides the method according to example B21, where the current mirror is a first current mirror, each of the portions of the clamp circuit further includes a second current mirror, having an input transistor and an output transistor, and the output transistor of the first current mirror is coupled to the output coupled to the other portion by having the output transistor of the first current mirror being coupled to the input transistor of the second current mirror and having the output transistor of the second current mirror being coupled to the output coupled to the other portion.

Example B23 provides a method, including steps performed by a system or a device according to any one of the preceding examples.

Example B24 provides a method, including steps that cause a system to operate according to any one of the preceding examples.

Example B25 provides a non-transitory computer-readable storage medium storing instructions which, when executed by a processor, cause the processor to perform at least portions of the methods according to any one of examples B21-B24.

Example B26 provides a computer program product including instructions which, when executed by a processor, cause the processor to perform at least portions of the methods according to any one of examples B21-B24.

Other Implementation Notes, Variations, and Applications

Principles and advantages discussed herein can be used in any device where differential clamping may need to take place. For example, differential clamp circuits with current recirculation according to various aspects of this disclosure can be implemented in ADC drivers or output stages for ADC drivers. In another example, differential clamp circuits with current recirculation according to various aspects of this disclosure can be implemented in various range finding systems such as any suitable LIDAR system (which may include, for example, automotive LIDAR, industrial LIDAR, space LIDAR, military LIDAR, etc.). LIDAR systems can include a receiver or a transmitter and a receiver. LIDAR systems can be integrated with a vehicle, such as an automobile, a drone such as an unmanned flying machine, an autonomous robot, or a space vehicle. LIDAR systems can be used for three-dimensional sensing applications. LIDAR systems can be used with augmented reality technology. Moreover, differential clamp circuits with current recirculation according to various aspects of this disclosure can be implemented in various electronic devices. Examples of the electronic devices can include, but are not limited to, electronic products, parts of electronic products such as integrated circuits, vehicular electronics such as automotive electronics, etc. Further, the electronic devices can include unfinished products.

While certain embodiments have been described, these embodiments have been presented by way of example, and are not intended to limit the scope of the disclosure. For example, while some embodiments refer to an APD being coupled to an input port of a TIA, these embodiments are equally applicable to any other device that can generate current pulses to be provided to an input of a TIA, e.g., to any other type of a PD. In another example, while some embodiments may refer to a PD that sinks current from the TIA, these embodiments may be modified, in a way that would be obvious to a person of ordinary skill in the art, to a PD that sources current to the TIA, all of which embodiments being, therefore, within the scope of the present disclosure. Indeed, the novel methods, apparatus, and systems related to differential clamp circuits with current recirculation, described herein, may be embodied in a variety of other forms. Furthermore, various omissions, substitutions and changes in the form of the methods, apparatus, and systems described herein may be made without departing from the spirit of the disclosure. For example, circuit blocks and/or circuit elements described herein may be deleted, moved, added, subdivided, combined, and/or modified. Each of these circuit blocks and/or circuit elements may be implemented in a variety of different ways. The accompanying claims and their equivalents are intended to cover any such forms or modifications as would fall within the scope and spirit of the disclosure.

Any of the principles and advantages discussed herein can be applied to other systems, devices, integrated circuits, electronic apparatus, methods, not just to the embodiments described above. The elements and operations of the various embodiments described above can be combined to provide further embodiments. The principles and advantages of the embodiments can be used in connection with any other systems, devices, integrated circuits, apparatus, or methods that could benefit from any of the teachings herein.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, controllers for configuring any of the components, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGS. may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the present drawings may be combined in various possible configurations, all of which are clearly within the broad scope of the present disclosure. In certain cases, it may be easier to describe one or more of the functionalities of a given set of flows by only referencing a limited number of electrical elements. It should be appreciated that the electrical circuits of the present drawings and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in the present disclosure, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended select examples. Note that all optional features of the apparatus described above may also be implemented with respect to the method or process described herein and specifics in the examples may be used anywhere in one or more embodiments.

The invention claimed is:

1. A system configured to clamp a differential signal that is output by an electronic component, the system comprising:
a clamp circuit, comprising a first portion and a second portion, each of the first and second portions coupled to a respective output of the differential signal and comprising:
a clamp transistor, coupled to a control signal that sets one of a minimum voltage value or a maximum voltage value for the output coupled to the portion, and
a current mirror, having an input transistor and an output transistor, wherein:
a first terminal of the clamp transistor of the first portion is coupled to the output coupled to the first portion,
a second terminal of the clamp transistor of the first portion is coupled to the input transistor of the current mirror of the first portion, and
the output transistor of the current mirror of the first portion is coupled to the output coupled to the second portion.

2. The system according to claim 1, wherein:
the current mirror is a first current mirror,
each of the first and second portions of the clamp circuit further includes a second current mirror, having an input transistor and an output transistor, and
the output transistor of the first current mirror of the first portion is coupled to the output coupled to the second portion by having the output transistor of the first current mirror of the first portion being coupled to the input transistor of the second current mirror of the first portion and having the output transistor of the second current mirror of the first portion being coupled to the output coupled to the second portion.

3. The system according to claim 2, wherein:
the differential signal is output by a differential current mirror of the electronic component, the differential current mirror includes a first current mirror portion and a second current mirror portion, each comprising a respective current mirror, an output transistor of the current mirror of the first current mirror portion is coupled to the output coupled to the first portion of the clamp circuit, an output transistor of the current mirror of the second current mirror portion is coupled to the output coupled to the second portion of the clamp circuit, the second current mirror of the first portion of the clamp circuit is the current mirror of the second current mirror portion, and the second current mirror of the second portion of the clamp circuit is the current mirror of the first current mirror portion.

4. The system according to claim 3, wherein, for each of the portions of the clamp circuit, a current gain of the second current mirror is inversely proportional to a current gain of the first current mirror.

5. The system according to claim 1, wherein:
the control signal is a control voltage signal, and
the control voltage signal sets the minimum voltage value.

6. The system according to claim 5, wherein, for each of the portions of the clamp circuit:
the clamp transistor is an N-type transistor, and
each of the input and the output transistors of the current mirror is a P-type transistor.

7. The system according to claim 1, wherein:
the control signal is a control voltage signal, and
the control voltage signal sets the maximum voltage value.

8. The system according to claim 7, wherein, for each of the portions of the clamp circuit:
the clamp transistor is a P-type transistor, and
each of the input and the output transistors of the current mirror is an N-type transistor.

9. The system according to claim 1, wherein:
the control signal is a control current signal, and
the control current signal sets the minimum voltage value.

10. The system according to claim 9 wherein, for each of the portions of the clamp circuit:
the clamp transistor is an N-type transistor, and
each of the input and the output transistors of the current mirror is a P-type transistor.

11. The system according to claim 1, wherein:
the control signal is a control current signal, and
the control current signal sets the maximum voltage value.

12. The system according to claim 11 wherein, for each of the portions of the clamp circuit:
the clamp transistor is a P-type transistor, and
each of the input and the output transistors of the current mirror is an N-type transistor.

13. The system according to claim 1, wherein:
when the clamp transistor of the first portion is configured to conduct current, the clamp transistor of the second portion is configured to not conduct current, and
when the clamp transistor of the second portion is configured to conduct current, the clamp transistor of the first portion is configured to not conduct current.

14. The system according to claim 1, wherein the system is a driver for an analog-to-digital converter.

15. The system according to claim 14, further including a transimpedance amplifier.

16. The system according to claim 15, wherein the differential signal to be clamped by the system is based on a signal output by the transimpedance amplifier.

17. The system according to claim 16, wherein the electronic component is a low-pass filter, and the differential signal is a signal output by the low-pass filter based on the signal output by the transimpedance amplifier.

18. The system according to claim 16, further including an optical sensor, where the signal output by the transimpedance amplifier is based on a signal output of the optical sensor.

19. The system according to claim 15, further including the analog-to-digital converter, where the differential signal clamped by the system is configured to drive the analog-to-digital converter.

20. A clamp circuit configured to limit voltage on a first and a second outputs of a differential signal, the clamp circuit comprising:
a first and a second current mirrors,
a first and a second clamp transistors,
wherein:
a first terminal of the first clamp transistor is coupled to the first output,
a second terminal of the first clamp transistor is coupled to an input of the first current mirror,
a third terminal of the first clamp transistor is coupled to a control signal that sets one of a minimum voltage value or a maximum voltage value for the first output,
an output of the first current mirror is coupled to the second output,
a first terminal of the second clamp transistor is coupled to the second output,
a second terminal of the second clamp transistor is coupled to an input of the second current mirror,
a third terminal of the second clamp transistor is coupled to a control signal that sets one of a minimum voltage value or a maximum voltage value for the second output, and
an output of the second current mirror is coupled to the first output.

21. The system according to claim 1, wherein:
a first terminal of the clamp transistor of the second portion is coupled to the output coupled to the second portion,
a second terminal of the clamp transistor of the second portion is coupled to the input transistor of the current mirror of the second portion, and
the output transistor of the current mirror of the second portion is coupled to the output coupled to the first portion.

22. The system according to claim 16, wherein:
the current mirror is a first current mirror,
each of the first and second portions of the clamp circuit further includes a second current mirror, having an input transistor and an output transistor, and
the output transistor of the first current mirror of the second portion is coupled to the output coupled to the first portion by having the output transistor of the first current mirror of the second portion being coupled to the input transistor of the second current mirror of the second portion and having the output transistor of the second current mirror of the second portion being coupled to the output coupled to the first portion.

23. The method according to claim 1, wherein:
a first terminal of the clamp transistor of the second portion is coupled to the output coupled to the second portion, a second terminal of the clamp transistor of the second portion is coupled to the input transistor of the current mirror of the second portion, and the output transistor of the current mirror of the second portion is coupled to the output coupled to the first portion.

24. The system according to claim 1, further including a transimpedance amplifier, where the differential signal to be clamped by the system is based on a signal output by the transimpedance amplifier.

25. The system according to claim 24, wherein the electronic component is a low-pass filter, and the differential signal is a signal output by the low-pass filter based on the signal output by the transimpedance amplifier.

26. The system according to claim 24, where the system is a light detection and ranging (LIDAR) system.

27. The clamp circuit according to claim 20, further comprising a third and a fourth current mirrors, wherein:

the output of the first current mirror is coupled to the second output by having the output of the first current mirror coupled to an input of the third current mirror, and having an output of the third current mirror coupled to the second output, and the output of the second current mirror is coupled to the first output by having the output of the second current mirror coupled to an input of the fourth current mirror, and having an output of the fourth current mirror coupled to the first output.

28. A method for enabling clamping of a differential signal that is output by an electronic component, the method comprising:

providing a clamp circuit, the clamp circuit comprising a first portion and a second portion, each of the portions coupled to a respective output of the differential signal and comprising:

a clamp transistor, coupled to a control signal that sets one of a minimum voltage value or a maximum voltage value for the output coupled to the portion, and a current mirror, having an input transistor and an output transistor, wherein:

a first terminal of the clamp transistor of the first portion is coupled to the output coupled to the first portion, a second terminal of the clamp transistor of the first portion is coupled to the input transistor of the current mirror of the first portion, and the output transistor of the current mirror of the first portion is coupled to the output coupled to the second portion.

\* \* \* \* \*